United States Patent
Kato et al.

(10) Patent No.: US 11,556,061 B2
(45) Date of Patent: Jan. 17, 2023

(54) MULTIPLE CHARGED PARTICLE BEAM WRITING APPARATUS AND MULTIPLE CHARGED PARTICLE BEAM WRITING METHOD

(71) Applicant: NuFlare Technology, Inc., Yokohama (JP)

(72) Inventors: Yasuo Kato, Yokohama (JP); Ryoh Kawana, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 17/483,947

(22) Filed: Sep. 24, 2021

(65) Prior Publication Data

US 2022/0107569 A1    Apr. 7, 2022

(30) Foreign Application Priority Data

Oct. 6, 2020  (JP) .............................. JP2020-169019

(51) Int. Cl.
*H01J 37/304* (2006.01)
*G03F 7/20* (2006.01)
*H01J 37/317* (2006.01)

(52) U.S. Cl.
CPC ........ *G03F 7/70558* (2013.01); *G03F 7/2037* (2013.01); *H01J 37/304* (2013.01); *H01J 37/3174* (2013.01)

(58) Field of Classification Search
CPC .. G03F 7/2037; G03F 7/2061; G03F 7/70558; H01J 2237/30455; H01J 2237/30472; H01J 2237/31754; H01J 2237/31762; H01J 37/304; H01J 37/3045; H01J 37/3174; H01J 37/3177
See application file for complete search history.

(56) References Cited

U.S. PATENT DOCUMENTS

| 9,269,543 B2 | 2/2016 | Reiter et al. |
| 2016/0155610 A1 | 6/2016 | Kawana et al. |

(Continued)

FOREIGN PATENT DOCUMENTS

| JP | 2016-103557 A | 6/2016 |
| JP | 2016-119423 A | 6/2016 |

(Continued)

*Primary Examiner* — Peter B Kim
(74) *Attorney, Agent, or Firm* — Oblon, McClelland, Maier & Neustadt, L.L.P.

(57) ABSTRACT

A multiple charged particle beam writing apparatus includes a margined block region generation circuit to generate plural margined block regions each formed by adding a margin region to the periphery of each block region of plural block regions obtained by dividing the writing region of the target object, a detection circuit to detect a defective beam in multiple charged particle beams, a specifying circuit to specify, for each defective beam detected, a position irradiated with the defective beam, and an affiliation determination circuit to determine a margined block region, in the plural margined block regions, to which the position irradiated with the defective beam belongs, based on conditions set according to a sub-block region, in plural sub-block regions acquired by dividing the margined block region, in which the position irradiated with the defective beam in the multiple charged particle beams is located.

10 Claims, 17 Drawing Sheets

(56) References Cited

U.S. PATENT DOCUMENTS

| | | |
|---|---|---|
| 2016/0181062 A1 | 6/2016 | Kato et al. |
| 2017/0103869 A1 | 4/2017 | Matsumoto |
| 2019/0043963 A1 | 2/2019 | Baars et al. |
| 2019/0378688 A1* | 12/2019 | Hasegawa ............... H01J 37/20 |
| 2020/0043701 A1 | 2/2020 | Matsumoto |

FOREIGN PATENT DOCUMENTS

| | | |
|---|---|---|
| JP | 2017-73461 A | 4/2017 |
| JP | 2019-33117 A | 2/2019 |
| JP | 2020-21919 A | 2/2020 |

\* cited by examiner

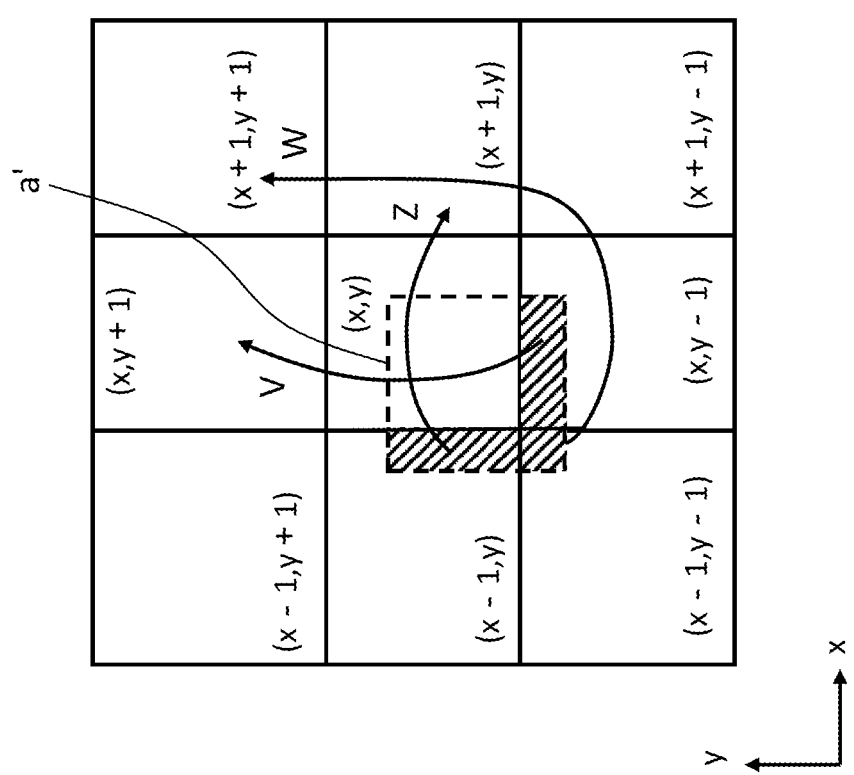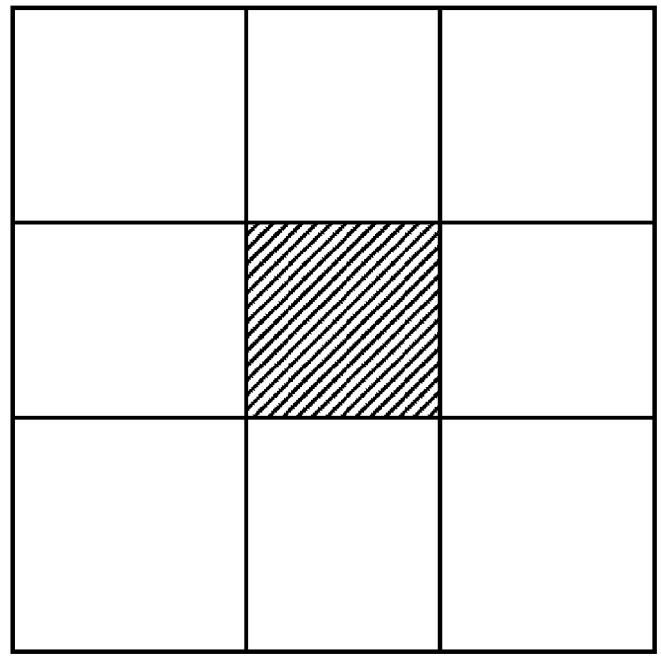
FIG.10B
FIG.10A

Defective Beam

| Defect Position | Conditions / Criteria |
|---|---|
| a | affiliate unconditionally |
| b | affiliate if not (b = 0 and C ≠ 0) |
| c | affiliate if (c = 0 and b ≠ 0) |
| d | affiliate if d ≠ 0 |
| e | affiliate if e = 0, d > f, d > e, and e symmetrically located |
| f | affiliate if f = 0, d > e, and d > e (the other e) |

MULTIPLE CHARGED PARTICLE BEAM WRITING APPARATUS AND MULTIPLE CHARGED PARTICLE BEAM WRITING METHOD

CROSS-REFERENCE TO RELATED APPLICATION

This application is based upon and claims the benefit of priority from prior Japanese Patent Application No. 2020-169019 filed on Oct. 6, 2020 in Japan, the entire contents of which are incorporated herein by reference.

BACKGROUND OF THE INVENTION

Field of the Invention

An embodiment of the present invention relates to a multiple charged particle beam writing apparatus and a multiple charged particle beam writing method, and for example, to a method for reducing pattern dimension deviation in multiple beam writing.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is becoming increasingly narrower year by year. The electron beam writing technique which intrinsically has excellent resolution is used for writing or "drawing" a mask pattern on a mask blank with electron beams.

For example, as a known example of employing the electron beam writing technique, there is a writing apparatus using multiple beams. Since it is possible for multi-beam writing to apply multiple beams at a time, the writing throughput can be greatly increased in comparison with single electron beam writing. For example, a writing apparatus employing the multi-beam system forms multiple beams by letting portions of an electron beam emitted from an electron gun individually pass through a corresponding one of a plurality of holes in a mask, performs blanking control for each beam, reduces, by an optical system, each beam which was not blocked in order to reduce a mask image, and deflects the beam by a deflector to irradiate a desired position on a target object or "sample".

In multi-beam writing, the dose of each beam is controlled based on an irradiation time. However, there is a possibility where since it becomes difficult to control the irradiation time due to failures of a blanking control mechanism, etc., a defective beam that irradiates a target object with an excessive dose more than a desired dose is generated. For example, an "always ON" beam (or beam being always ON) is a representative example. There is a problem that if a target object is irradiated with an excessive dose, there occurs a shape error of a pattern formed on the target object. To solve this problem, there is proposed a method for irradiating while reducing a corresponding assigned dose amount from the dose of each of peripheral beams such that the same amount of dose as the excessive dose resulting from a defective beam is assigned to peripheral beams of the defective beam (e.g., refer to Japanese Patent Application Laid-open (JP-A) No. 2020-021919).

Here, in order to generate shot data at a high speed in accordance with the speed of writing processing, it is necessary to divide the data processing region into a plurality of blocks and execute parallel processing. However, the position of data needed for correction processing for a defective beam may extend over a plurality of blocks. In such a case, there is a problem that the efficiency of parallel processing is decreased when data is exchanged between blocks.

BRIEF SUMMARY OF THE INVENTION

According to one aspect of the present invention, a multiple charged particle beam writing apparatus includes a plurality of dose data generation circuits configured to generate data on a dose at each position in a writing region of a target object;

a margined block region generation circuit configured to generate a plurality of margined block regions each formed by adding a margin region to a periphery of each block region of a plurality of block regions obtained by dividing the writing region of the target object;

a detection circuit configured to detect a defective beam in multiple charged particle beams;

a specifying circuit configured to specify, for each of the defective beam detected, a position irradiated with the defective beam;

an affiliation determination circuit configured to determine a margined block region, in the plurality of margined block regions, to which the position irradiated with the defective beam belongs, based on conditions set according to a sub-block region, in a plurality of sub-block regions acquired by dividing the margined block region, in which the position irradiated with the defective beam in the multiple charged particle beams is located;

a defective beam correction circuit configured to calculate a correction dose at at least one position for correcting a dose abnormality resulting from the defective beam, by using data on a dose at each position in the margined block region to which the position irradiated with the defective beam belongs; and a writing mechanism configured to write a pattern on the target object, using the multiple charged particle beams in which the dose at the at least one position for correcting the dose abnormality has been controlled by the correction dose.

According to another aspect of the present invention, a multiple charged particle beam writing apparatus includes a plurality of dose data generation circuits configured to generate data on a dose at each position in a writing region of a target object;

a margined block region generation circuit configured to generate a plurality of margined block regions each formed by adding a margin region to a periphery of each block region of a plurality of block regions obtained by dividing the writing region of the target object;

a detection circuit configured to detect a defective beam in multiple charged particle beams;

a specifying circuit configured to specify, for each of the defective beam detected, a position irradiated with the defective beam;

at least one defective beam correction circuit configured to calculate a correction dose at at least one position for correcting a dose abnormality resulting from the defective beam, by using data on a dose at each position in an own margined block region, with respect to one margined block region in a case where the position irradiated with the defective beam in the multiple charged particle beams overlaps with the one margined block region, and in parallel with respect to a plurality of margined block regions in a case where the position irradiated with the defective beam overlaps with the plurality of margined block regions, and a writing mechanism configured to write a pattern on the target object, using the multiple charged particle beams in which a dose at at least one position for correcting the dose abnormality has been controlled by the correction dose at the at least one position calculated with respect to the one margined block region in the case where the position irradiated with the defective beam overlaps with the one margined block region, and using the multiple charged particle beams in which the dose at the at least one position for correcting the dose abnormality has been controlled by a correction dose in one set selected from a plurality of sets each being a correction dose at at least one position in any one margined block region calculated in parallel with respect to the plurality of margined block regions in the case where the position irradiated with the defective beam overlaps with the plurality of margined block regions.

According to yet another aspect of the present invention, a multiple charged particle beam writing method includes generating data on a dose at each position in a writing region of a target object;

generating a plurality of margined block regions each formed by adding a margin region to a periphery of each block region of a plurality of block regions obtained by dividing the writing region of the target object;

detecting a defective beam in multiple charged particle beams;

specifying, for each of the defective beam detected, a position irradiated with the defective beam;

determining a margined block region, in the plurality of margined block regions, to which the position irradiated with the defective beam belongs, based on conditions set according to a sub-block region, in a plurality of sub-block regions acquired by dividing the margined block region, in which the position irradiated with the defective beam in the multiple charged particle beams is located;

calculating a correction dose at at least one position for correcting a dose abnormality resulting from the defective beam, by using data on a dose at each position in the margined block region to which the position irradiated with the defective beam belongs; and writing a pattern on the target object, using the multiple charged particle beams in which the dose at the at least one position for correcting the dose abnormality has been controlled by the correction dose.

According to yet another aspect of the present invention, a multiple charged particle beam writing method includes generating data on a dose at each position in a writing region of a target object;

generating a plurality of margined block regions each formed by adding a margin region to a periphery of each block region of a plurality of block regions obtained by dividing the writing region of the target object;

detecting a defective beam in multiple charged particle beams;

specifying, for each of the defective beam detected, a position irradiated with the defective beam;

calculating a correction dose at at least one position for correcting a dose abnormality resulting from the defective beam, by using data on a dose at each position in an own margined block region, with respect to one margined block region in a case where the position irradiated with the defective beam in the multiple charged particle beams overlaps with the one margined block region, and in parallel with respect to a plurality of margined block regions in a case where the position irradiated with the defective beam overlaps with the plurality of margined block regions, and writing a pattern on the target object by using the multiple charged particle beams in which a dose at at least one position for correcting the dose abnormality has been controlled by the correction dose at the at least one position calculated with respect to the one margined block region in the case where the position irradiated with the defective beam overlaps with the one margined block region, and by using the multiple charged particle beams in which the dose at the at least one position for correcting the dose abnormality has been controlled by a correction dose in one set selected from a plurality of sets each being a correction dose at at least one position in any one margined block region calculated in parallel with respect to the plurality of margined block regions in the case where the position irradiated with the defective beam overlaps with the plurality of margined block regions.

BRIEF DESCRIPTION OF THE DRAWINGS

FIGS. 10A and 10B show an example of a method for correcting a position deviation according to the first embodiment;

DETAILED DESCRIPTION OF THE INVENTION

Embodiments below describe, in multi-beam writing, a writing apparatus and method that can perform correction processing for a defective beam without exchanging data between blocks.

Embodiments below describe a configuration in which an electron beam is used as an example of a charged particle beam. The charged particle beam is not limited to the electron beam, and other charged particle beam such as an ion beam may also be used. However, it is not limited thereto, and other charged particle beam such as an ion beam may also be used.

First Embodiment

Figure 1:
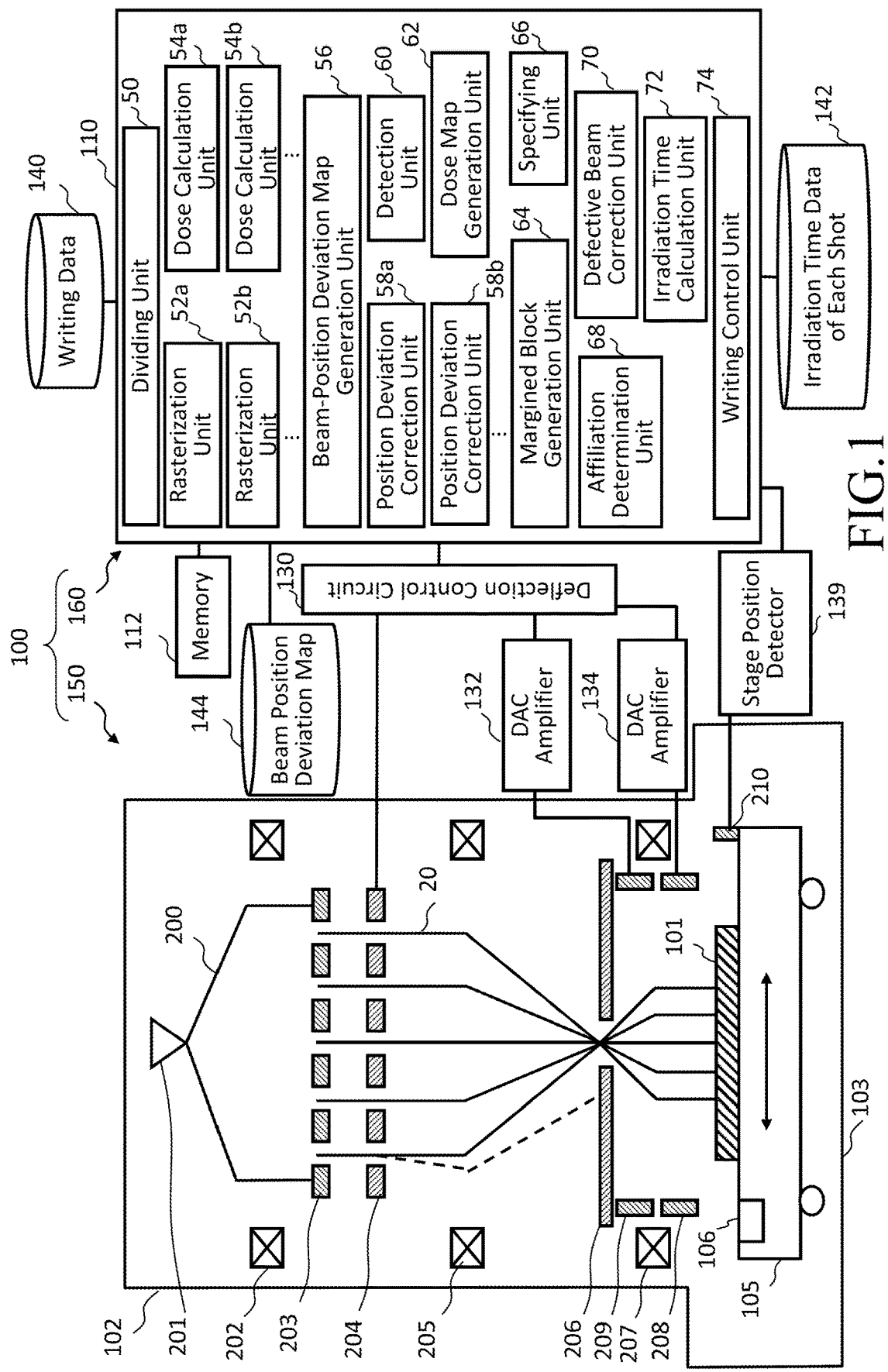
FIG. 1 is a schematic diagram showing a configuration of a writing apparatus according to a first embodiment.

FIG. 1 is a schematic diagram showing a configuration of a writing or "drawing" apparatus according to a first embodiment. As shown in FIG. 1, a writing apparatus 100 includes a writing mechanism 150 and a control system circuit 160. The writing apparatus 100 is an example of a multiple charged particle beam writing apparatus. The writing mechanism 150 includes an electron beam column 102 (multiple electron beam column) and a writing chamber 103. In the electron beam column 102, there are disposed an electron gun 201, an illumination lens 202, a shaping aperture array substrate 203, a blanking aperture array mechanism 204, a reducing lens 205, a limiting aperture substrate 206, an objective lens 207, a deflector 208, and a deflector 209. In the writing chamber 103, an XY stage 105 is disposed. On the XY stage 105, there is placed a target object or "sample" 101 such as a mask blank on which resist has been applied serving as a writing target substrate when writing is performed. The target object 101 is, for example, an exposure mask used when fabricating semiconductor devices, or a semiconductor substrate (silicon wafer) for fabricating semiconductor devices. Further, on the XY stage 105, a mirror 210 for measuring the position of the XY stage 105 is placed. Furthermore, a Faraday cup 106 is placed on the XY stage 105.

The control system circuit 160 includes a control computer 110, a memory 112, a deflection control circuit 130, DAC (digital-analog converter) amplifier units 132 and 134, a stage position detector 139, and storage devices 140, 142, and 144 such as magnetic disk drives. The control computer 110, the memory 112, the deflection control circuit 130, the DAC amplifier units 132 and 134, the stage position detector 139, and the storage devices 140, 142, and 144 are connected to each other through a bus (not shown). The DAC amplifier units 132 and 134 and the blanking aperture array mechanism 204 are connected to the deflection control circuit 130. Outputs of the DAC amplifier unit 132 are connected to the deflector 209. Outputs of the DAC amplifier unit 134 are connected to the deflector 208. The deflector 208 is composed of at least four electrodes (or "poles"), and controlled by the deflection control circuit 130 through a corresponding amplifier of the DAC amplifier unit 134 disposed for each electrode. The deflector 209 is composed of at least four electrodes (or "poles"), and controlled by the deflection control circuit 130 through a corresponding amplifier of the DAC amplifier unit 132 disposed for each electrode. The stage position detector 139 emits laser lights to the mirror 210 on the XY stage 105, and receives a reflected light from the mirror 210. The stage position detector 139 measures the position of the XY stage 105, based on the principle of laser interferometry which uses information of the reflected light.

In the control computer 110, there are arranged a dividing unit 50, a plurality of rasterization units 52 (52a, 52b, ... ), a plurality of dose calculation units 54 (54a, 54b, ... ), a beam-position deviation map generation unit 56, a plurality of position deviation correction units 58 (58a, 58b, ... ), a detection unit 60, a dose map generation unit 62, a margined block generation unit 64, a specifying unit 66, an affiliation determination unit 68, a defective beam correction unit 70, an irradiation time calculation unit 72, and a writing control unit 74. Each of the " ... units" such as the dividing unit 50, the plurality of rasterization units 52 (52a, 52b, ... ), the plurality of dose calculation units 54 (54a, 54b, ... ), the beam-position deviation map generation unit 56, the plurality of position deviation correction units 58 (58a, 58b, ... ), the detection unit 60, the dose map generation unit 62, the margined block generation unit 64, the specifying unit 66, the affiliation determination unit 68, the defective beam correction unit 70, the irradiation time calculation unit 72, and the writing control unit 74 includes processing circuitry. As the processing circuitry, for example, an electric circuit, computer, processor, circuit board, quantum circuit, or semiconductor device can be used. Each " ... unit" may use common processing circuitry (the same processing circuitry), or different processing circuitry (separate processing circuitry). Information input/output to/from the dividing unit 50, the plurality of rasterization units 52 (52a, 52b, ... ), the plurality of dose calculation units 54 (54a, 54b, ... ), the beam-position deviation map generation unit 56, the plurality of position deviation correction units 58 (58a, 58b, ... ), the detection unit 60, the dose map generation unit 62, the margined block generation unit 64, the specifying unit 66, the affiliation determination unit 68, the defective beam correction unit 70, the irradiation time calculation unit 72, and the writing control unit 74, and information being operated are stored in the memory 112 each time. Although one defective beam correction unit 70 is shown in FIG. 1, a plurality of defective beam correction units which can be processed in parallel may also be arranged.

Writing data is input from the outside of the writing apparatus 100, and stored in the storage device 140. The writing data generally defines information on a plurality of figure patterns to be written. Specifically, it defines a figure code, coordinates, size, etc. of each figure pattern.

FIG. 1 shows a configuration necessary for describing the first embodiment. Other configuration elements generally necessary for the writing apparatus 100 may also be included therein.

Figure 2:
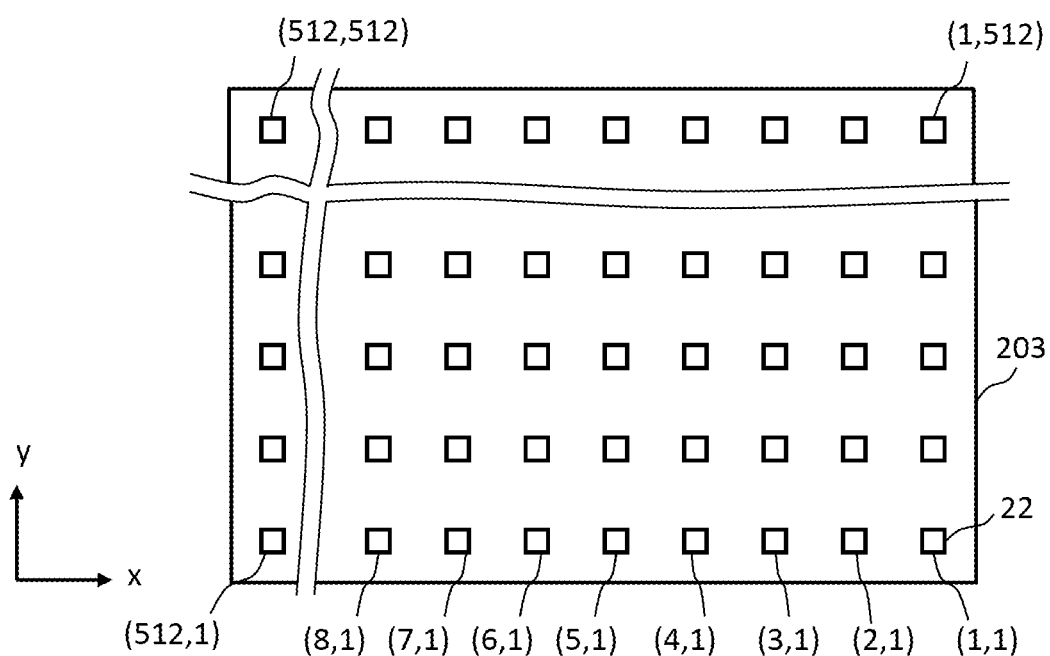
FIG. 2 is a conceptual diagram showing a configuration of a shaping aperture array substrate according to the first embodiment.

FIG. 2 is a conceptual diagram showing a configuration of the shaping aperture array substrate 203 according to the first embodiment. As shown in FIG. 2, holes (openings) 22 of p rows long (length in the y direction) and q columns wide (width in the x direction) (p≥2, q≥2) are formed, like a matrix, at a predetermined arrangement pitch in the shaping aperture array substrate 203. In the case of FIG. 2, for example, holes (openings) 22 of 512×512, that is 512 (rows of holes arrayed in the y direction)×512 (columns of holes arrayed in the x direction), are formed. Each of the holes 22 is rectangular, including square, having the same dimension and shape as each other. Alternatively, each of the holes 22 may be a circle with the same diameter as each other. The shaping aperture array substrate 203 (beam forming mechanism) forms the multiple beams 20. Specifically, the multiple beams 20 are formed by letting portions of the electron beam 200 individually pass through a corresponding one of a plurality of holes 22. The method of arranging the holes 22 is not limited to the case of FIG. 2 where the holes are arranged like a grid in the width and length directions. For example, with respect to the kth and the (k+1)th rows which are arrayed (accumulated) in the length direction (in the y direction) and each of which is in the x direction, each hole in the kth row and each hole in the (k+1)th row may be mutually displaced in the width direction (in the x direction) by a dimension "a". Similarly, with respect to the (k+1)th and the (k+2)th rows which are arrayed (accumulated) in the length direction (in the y direction) and each of which is in the x direction, each hole in the (k+1)th row and each hole in the (k+2)th row may be mutually displaced in the width direction (in the x direction) by a dimension "b".

Figure 3:
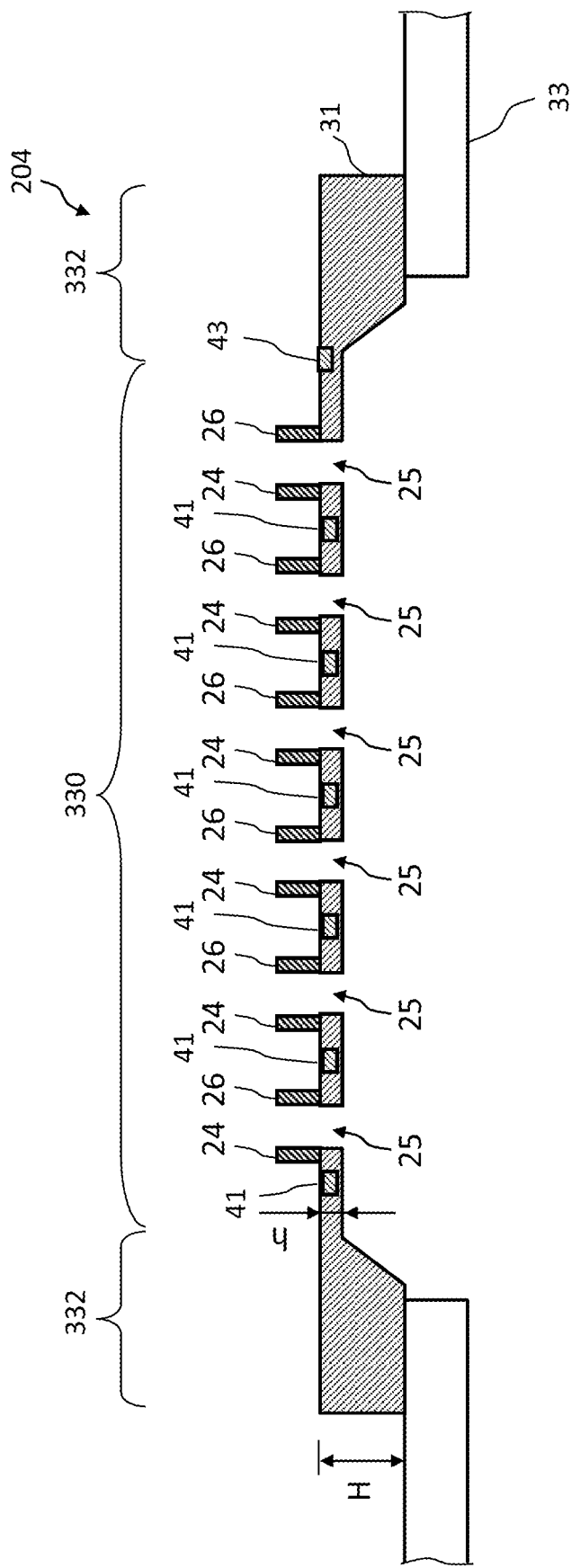
FIG. 3 is a sectional view showing a configuration of a blanking aperture array mechanism according to the first embodiment.

FIG. 3 is a sectional view showing a configuration of a blanking aperture array mechanism 204 according to the first embodiment. With regard to the structure of the blanking aperture array mechanism 204, a semiconductor substrate 31 made of silicon, etc. is placed on a support table 33 as shown in FIG. 3. The central part of the substrate 31 is shaved, for example, from the back side, and made into a membrane region 330 (first region) having a thin film thickness h. The periphery surrounding the membrane region 330 is an outer peripheral region 332 (second region) having a thick film thickness H. The upper surface of the membrane region 330 and the upper surface of the outer peripheral region 332 are formed to be flush or substantially flush in height with each other. At the back side of the outer peripheral region 332, the substrate 31 is supported on the support table 33. The central part of the support table 33 is open, and the membrane region 330 is located at this opening region.

In the membrane region 330, passage holes 25 (openings) through each of which a corresponding one of the multiple beams 20 passes are formed at positions each corresponding to each hole 22 in the shaping aperture array substrate 203 shown in FIG. 2. In other words, in the membrane region 330 of the substrate 31, there are formed a plurality of passage holes 25 in an array through each of which a corresponding one of the multiple beams 20 passes. Moreover, in the membrane region 330 of the substrate 31, there are arranged a plurality of electrode pairs each composed of two electrodes being opposite to each other with respect to a corresponding one of a plurality of passage holes 25. Specifically, in the membrane region 330, as shown in FIG. 3, each pair (blanker: blanking deflector) of a control electrode 24 and a counter electrode 26 for blanking deflection is arranged close to a corresponding passage hole 25 in a manner such that the electrodes 24 and 26 are opposite to each other across the passage hole 25 concerned. Moreover, close to each passage hole 25 in the membrane region 330 of the substrate 31, there is arranged a control circuit 41 (logic circuit) which applies a deflection voltage to the control electrode 24 for the passage hole 25 concerned. The counter electrode 26 for each beam is grounded.

To each control circuit 41, n-bit (e.g., 10-bit) parallel lines for control signals are connected. In addition to the n-bit parallel lines for controlling signals, lines for a clock signal, a read signal, a shot signal, a power supply, and the like are connected to each control circuit 41. Alternatively, a part of the parallel lines may be used as the lines for a clock signal, a read signal, a shot signal, a power supply, and the like. An individual blanking control mechanism composed of the control electrode 24, the counter electrode 26, and the control circuit 41 is configured for each of the multiple beams. A plurality of logic circuits 41 formed in an array in the membrane region 330 are grouped, for example, per row or per column, and the logic circuits 41 in each group are connected in series. Then, a pad 43 arranged for each group sends a signal to the logic circuits 41 in the group concerned. Specifically, a shift register (not shown) is arranged in each control circuit 41, and shift registers in the logic circuits 41 for beams in the same row, for example, in p×q, for example, multiple beams are connected in series. For example, control signals for beams in the same row in the p×q multiple beams are transmitted in series, and, a control signal for each beam is stored in a corresponding control circuit 41 by p clock signals totally, for example.

An amplifier (not shown) (an example of a switching circuit) is arranged in the control circuit 41. A CMOS (complementary MOS) inverter circuit is arranged as an example of the amplifier. The output line (OUT) of the CMOS inverter circuit is connected to the control electrode 24. On the other hand, the counter electrode 26 is applied with a ground electric potential. As an input (IN) of each CMOS inverter circuit, either an L (low) potential (e.g., ground potential) lower than a threshold voltage, or an H (high) potential (e.g., 1.5 V) higher than or equal to the threshold voltage is applied as a control signal. According to the first embodiment, in a state where an L potential is applied to the input (IN) of the CMOS inverter circuit, the output (OUT) of the CMOS inverter circuit becomes a positive potential (Vdd), and then, a corresponding beam is deflected by an electric field due to a potential difference from the ground potential of the counter electrode 26 so as to be blocked by the limiting aperture substrate 206, and thus it is controlled to be in a beam OFF condition. On the other hand, in a state (active state) where an H potential is applied to the input (IN) of the CMOS inverter circuit, the output (OUT) of the CMOS inverter circuit becomes a ground potential, and therefore, since there is no potential difference from the ground potential of the counter electrode 26, a corresponding beam is not deflected, and thus it is controlled to be in a beam ON condition by making the beam concerned pass through the limiting aperture substrate 206.

A pair of the control electrode 24 and the counter electrode 26 individually provides blanking deflection of a corresponding electron beam of multiple beams 20 by an electric potential switchable by the CMOS inverter circuit which serves as a corresponding switching circuit. Thus, each of a plurality of blankers performs blanking deflection of a corresponding beam in the multiple beams having passed through a plurality of holes 22 (openings) in the shaping aperture array substrate 203.

Figure 4:
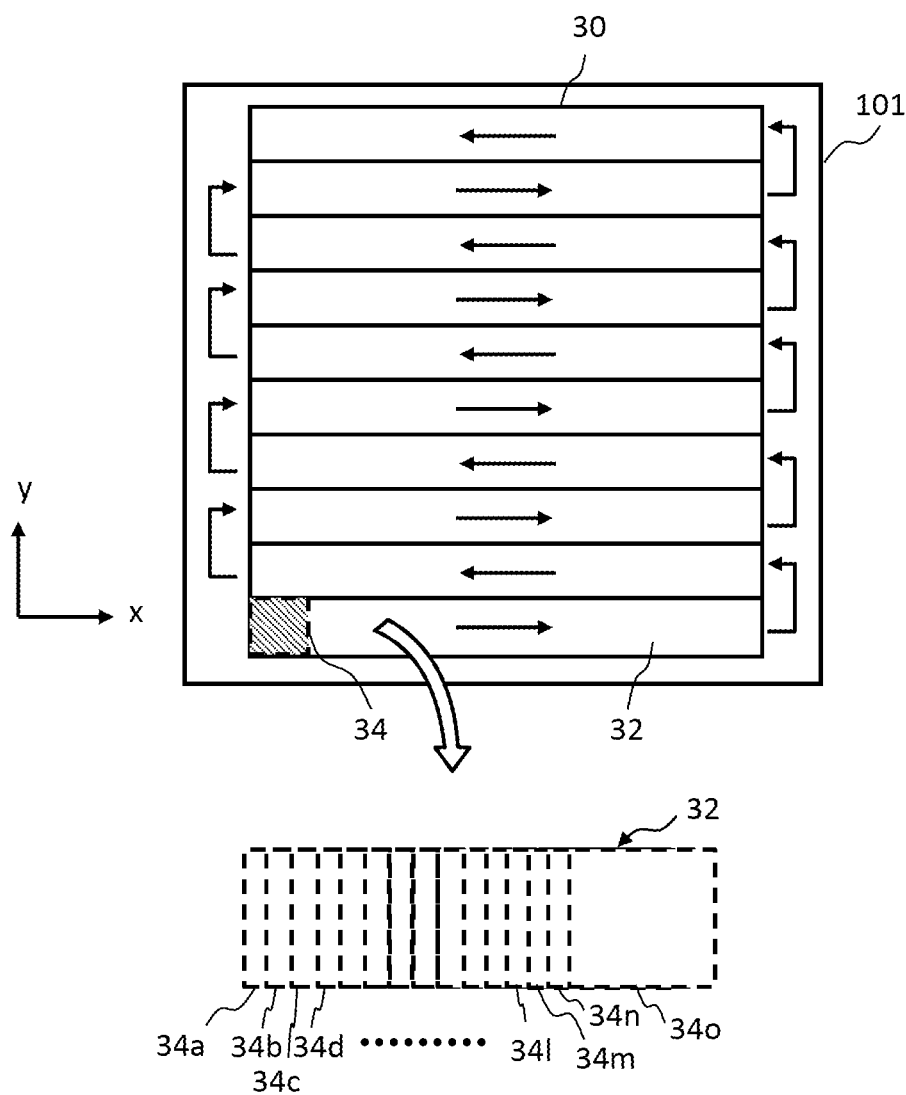
FIG. 4 is a conceptual diagram illustrating an example of a writing operation according to the first embodiment.

FIG. 4 is a conceptual diagram illustrating an example of a writing operation according to the first embodiment. As shown in FIG. 4, a writing region 30 of the target object 101 is virtually divided, for example, by a predetermined width in the y direction into a plurality of stripe regions 32 in a strip form. First, the XY stage 105 is moved to make an adjustment such that an irradiation region 34 which can be irradiated with one shot of the multiple beams 20 is located at the left end of the first stripe region 32 or at a position further left than the left end, and then writing is started. When writing the first stripe region 32, the XY stage 105 is moved, for example, in the −x direction, so that the writing may relatively proceed in the x direction. The XY stage 105 is moved, for example, continuously at a constant speed. After writing the first stripe region 32, the stage position is moved in the −y direction to make an adjustment such that the irradiation region 34 is located at the right end of the second stripe region 32 or at a position further right than the right end to be thus located relatively in the y direction. Then, by moving the XY stage 105 in the x direction, for example, writing proceeds in the −x direction. That is, writing is performed while alternately changing the direction, such as performing writing in the x direction in the third stripe region 32, and in the −x direction in the fourth stripe region 32, thereby reducing the writing time. However, the writing operation is not limited to the writing while alternately changing the direction, and it is also preferable to perform writing in the same direction when writing each stripe region 32. A plurality of shot patterns maximally up to as many as the number of the holes 22 are formed at a time by one shot of multiple beams having been formed by passing through the holes 22 in the shaping aperture array substrate 203. Further, although FIG. 4 shows the case where writing is performed once for each stripe region 32, it is not limited thereto. It is also preferable to perform multiple writing which writes the same region multiple times. In performing the multiple writing, preferably, the stripe region 32 of each pass is set while shifting the position.

Figure 5:
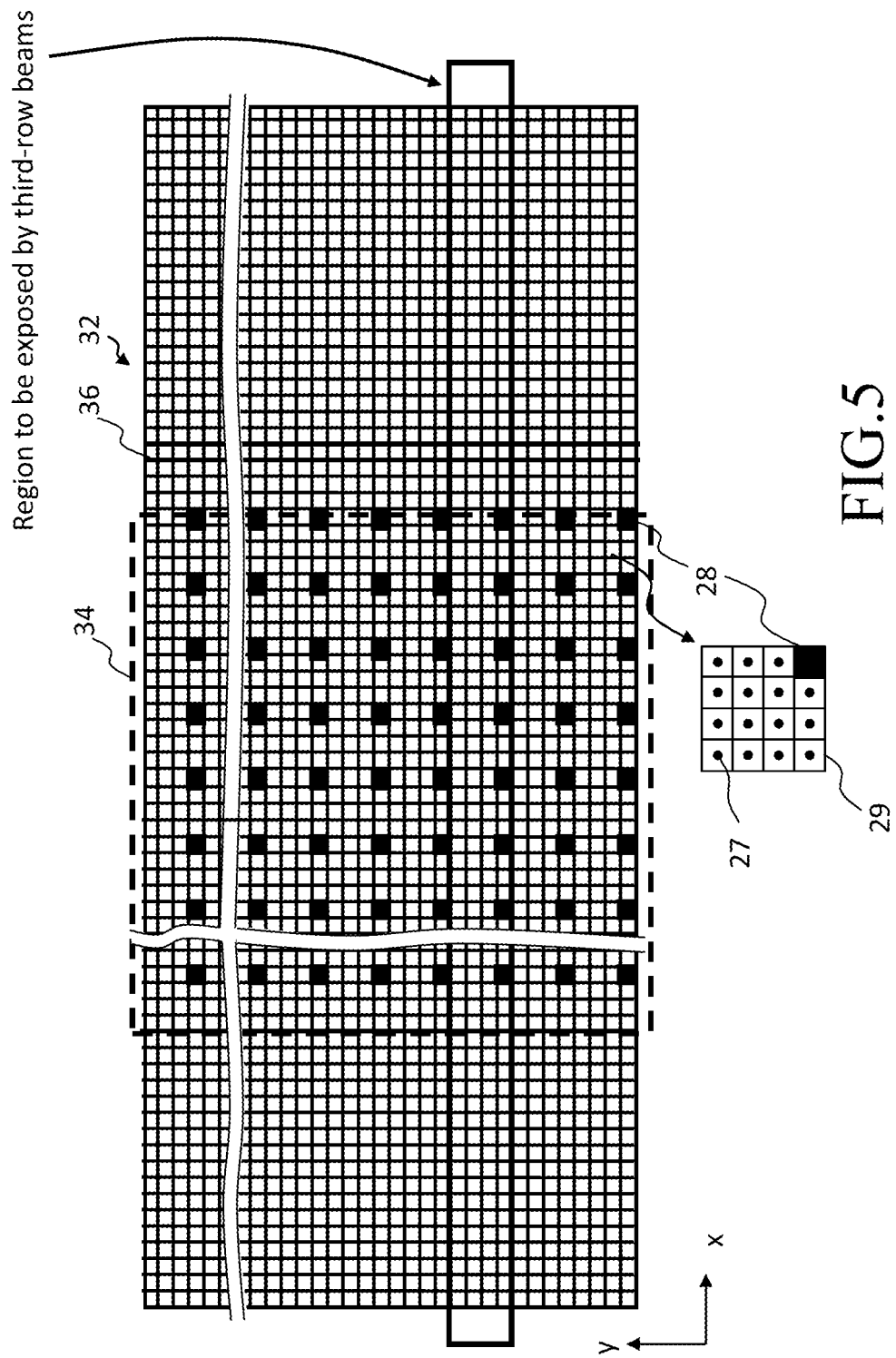
FIG. 5 shows an example of an irradiation region of multiple beams and a pixel to be written according to the first embodiment.

FIG. 5 shows an example of an irradiation region of multiple beams and a pixel to be written (writing target pixel) according to the first embodiment. In FIG. 5, in the stripe region 32, there are set a plurality of control grids (design grids) arranged in a grid form at the beam size pitch of the multiple beams 20 on the surface of the target object 101, for example. Preferably, they are arranged at a pitch of around 10 nm. The plurality of control grids 27 serve as design irradiation positions of the multiple beams 20. The arrangement pitch of the control grid 27 is not limited to the beam size, and may be an arbitrary size which can be controlled as a deflection position of the deflector 209, regardless of the beam size. Then, a plurality of pixels 36 obtained by virtually dividing into a mesh form by the same size as that of the arrangement pitch of the control grid 27 are set, each of which is centering on each control grid 27. Each pixel 36 serves as an irradiation unit region per beam of the multiple beams. FIG. 5 shows the case where the writing region of the target object 101 is divided, for example, in the y direction, into a plurality of stripe regions 32 by the width size being substantially the same as the size of the irradiation region 34 (writing field) which can be irradiated by one irradiation with the multiple beams 20. The x-direction size of the irradiation region 34 can be defined by the value obtained by multiplying the beam pitch (pitch between beams) in the x direction of the multiple beams 20 by the number of beams in the x direction. The y-direction size of the irradiation region 34 can be defined by the value obtained by multiplying the beam pitch in the y direction of the multiple beams 20 by the number of beams in the y direction. The width of the stripe region 32 is not limited to this. Preferably, the width of the stripe region 32 is n times (n being an integer of one or more) the size of the irradiation region 34. FIG. 5 shows the case where the multiple beams of 512×512 (rows×columns) are simplified to 8×8 (rows× columns). In the irradiation region 34, there are shown a plurality of pixels 28 (beam writing positions) which can be irradiated with one shot of the multiple beams 20. In other words, the pitch between adjacent pixels 28 is the pitch between beams of the design multiple beams. In the example of FIG. 5, one sub-irradiation region 29 is a region surrounded by beam pitches. In the case of FIG. 5, each sub-irradiation region 29 is composed of 4×4 pixels.

Figure 6:
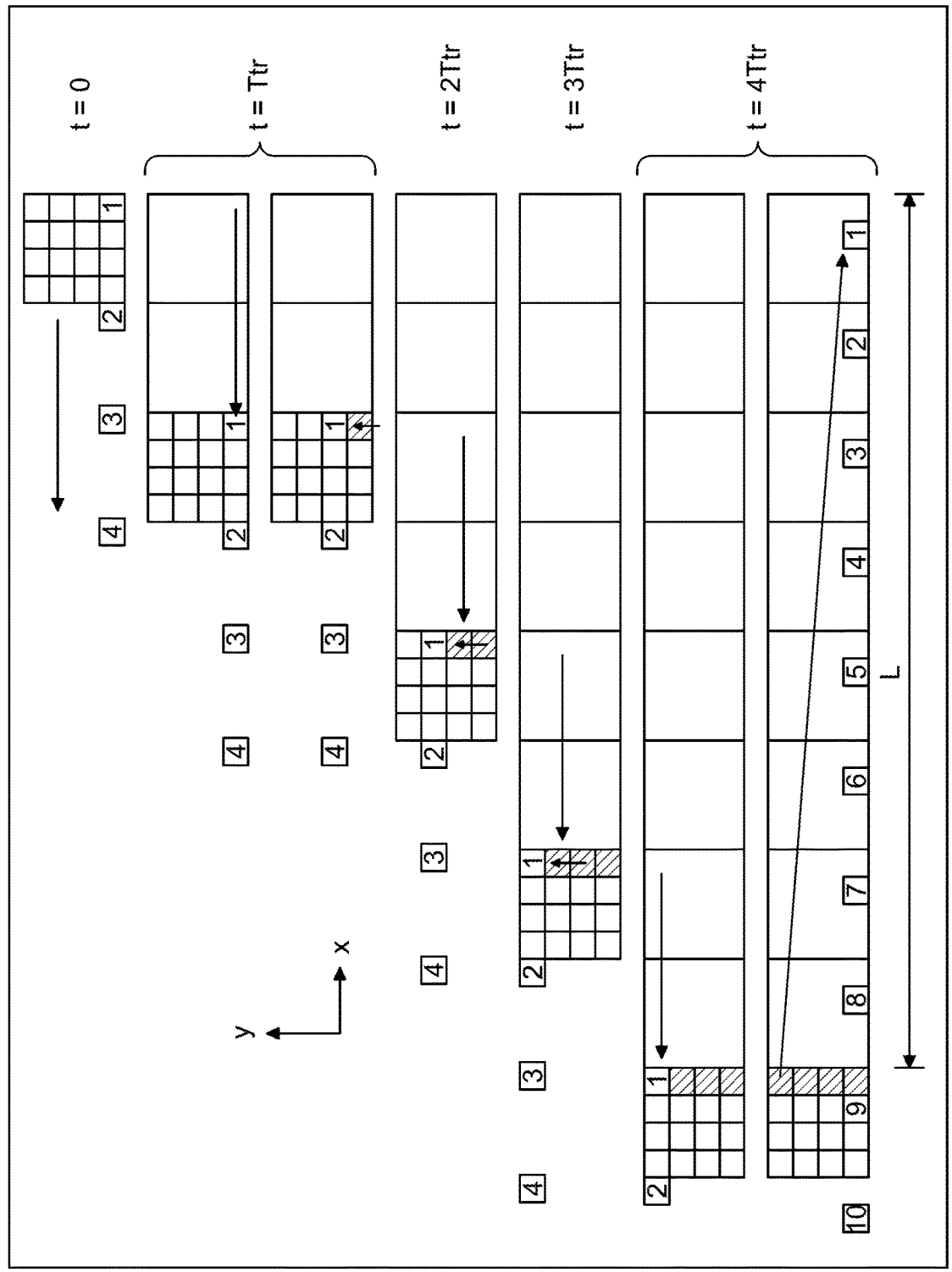
FIG. 6 shows an example of a writing method of multiple beams according to the first embodiment.

FIG. 6 illustrates an example of a writing method of multiple beams according to the first embodiment. FIG. 6 shows a portion of the sub-irradiation region 29 to be written by each of beams at the coordinates (1, 3), (2, 3), (3, 3), . . ., (512, 3) in the third row from the bottom in the multiple beams for writing the stripe region 32 shown in FIG. 5. In the example of FIG. 6, while the XY stage 105 moves the distance of eight beam pitches, four pixels are written (exposed), for example. In order that the relative position between the irradiation region 34 and the target object 101 may not be shifted by the movement of the XY stage 105 while these four pixels are written (exposed), the irradiation region 34 is made to follow the movement of the XY stage 105 by collective deflection of all of the multiple beams 20 by the deflector 208. In other words, tracking control is performed. In the case of FIG. 6, one tracking cycle is executed by writing (exposing) four pixels while shifting, per shot, the irradiation target pixel 36 in the y direction during a movement by the distance of eight beam pitches.

Specifically, the writing mechanism 150 irradiates each control grid 27 with a corresponding beam in an ON state in the multiple beams 20 during a writing time (irradiation time or exposure time) corresponding to each control grid 27 within a maximum irradiation time Ttr of the irradiation time of each of the multiple beams of the shot concerned. The maximum irradiation time Ttr is set in advance. Although the time obtained by adding a settling time of beam deflection to the maximum irradiation time Ttr actually serves as a shot cycle, the settling time of beam deflection is here omitted to indicate the maximum irradiation time Ttr as the shot cycle. After one tracking cycle is completed, the tracking control is reset so as to swing back (return) the tracking position to the starting position of a next tracking cycle.

Since writing of the pixels in the first column from the right of each sub-irradiation region 29 has been completed, the deflector 209 performs deflection, after resetting the tracking, in a next tracking cycle, such that the writing position of each corresponding beam is adjusted (shifted) to the control grid 27 of the pixel at the bottom row in the second column from the right of each sub-irradiation region 29.

As described above, in the state where the relative position of the irradiation region 34 to the target object 101 is controlled by the deflector 208 to be the same (unchanged) position during the same tracking cycle, each shot is carried out while performing shifting from a control grid 27 (a pixel 36) to another control grid 27 (another pixel 36) by the deflector 209. Then, after finishing one tracking cycle and returning the tracking position of the irradiation region 34, the first shot position is adjusted to the position shifted by, for example, one control grid (one pixel) as shown in the lower part of FIG. 4, and each shot is performed shifting from one control grid (one pixel) to another control grid (another pixel) by the deflector 209 while executing a next tracking control. By repeating this operation during writing the stripe region 32, the position of the irradiation region 34 is shifted consecutively, such as from 34a to 34o, to perform writing of the stripe region concerned.

Based on the writing sequence, it is determined which beam of the multiple beams irradiates which control grid 27 (pixel 36) on the target object 101. Supposing that the sub-irradiation region 29 is a region composed of n×n pixels, n control grids (n pixels) are written by one tracking operation. Then, by the next tracking operation, other n pixels in the same n×n pixel region are similarly written by a different beam from the one used above. Thus, writing is performed for each n pixels by a different beam each time in n-time tracking operations, thereby writing all of the pixels in one region of n×n pixels. With respect also to other sub-irradiation regions 29 each composed of n×n pixels in the irradiation region of multiple beams, the same operation is executed at the same time so as to perform writing similarly.

Next, operations of the writing mechanism 150 of the writing apparatus 100 will be described. The electron beam 200 emitted from the electron gun 201 (emission source) illuminates the whole of the shaping aperture array substrate 203 by the illumination lens 202. A plurality of quadrangular holes 22 (openings) are formed in the shaping aperture array substrate 203. The region including all of the plurality of holes 22 is irradiated with the electron beam 200. For example, a plurality of quadrangular electron beams (multiple beams 20) are formed by letting portions of the electron beam 200, which irradiates the positions of the plurality of holes 22, individually pass through a corresponding hole of the plurality of holes 22 of the shaping aperture array substrate 203. The multiple beams 20 individually pass through corresponding blankers (first deflector: individual blanking mechanism) of the blanking aperture array mechanism 204. Each blanker deflects (provides blanking deflection) an electron beam passing individually.

The multiple beams 20 having passed through the blanking aperture array mechanism 204 are reduced by the reducing lens 205, and go toward the hole in the center of the limiting aperture substrate 206. Then, the electron beam, which was deflected by the blanker of the blanking aperture array mechanism 204, in the multiple beams 20 deviates (shifts) from the hole in the center of the limiting substrate 206 and is blocked by the limiting aperture substrate 206. On the other hand, the electron beam, which was not deflected by the blanker of the blanking aperture array mechanism 204, passes through the hole in the center of the limiting aperture substrate 206 as shown in FIG. 1. Blanking control is provided by ON/OFF of the individual blanking mechanism so as to control ON/OFF of beams. Then, for each beam, one shot beam is formed by a beam which has been made during a period from becoming beam ON to becoming beam OFF and has passed through the limiting aperture substrate 206. The multiple beams 20 having passed through the limiting aperture substrate 206 are focused by the objective lens 207 so as to be a pattern image of a desired reduction ratio. Then, respective beams having passed (all of the multiple beams 20 having passed) through the limiting aperture substrate 206 are collectively deflected in the same direction by the deflectors 208 and 209 in order to irradiate respective beam irradiation positions on the target object 101. Ideally, the multiple beams 20 irradiating at a time are aligned at pitches obtained by multiplying the arrangement pitch of a plurality of holes 22 of the shaping aperture array substrate 203 by a desired reduction ratio described above.

Figure 7:
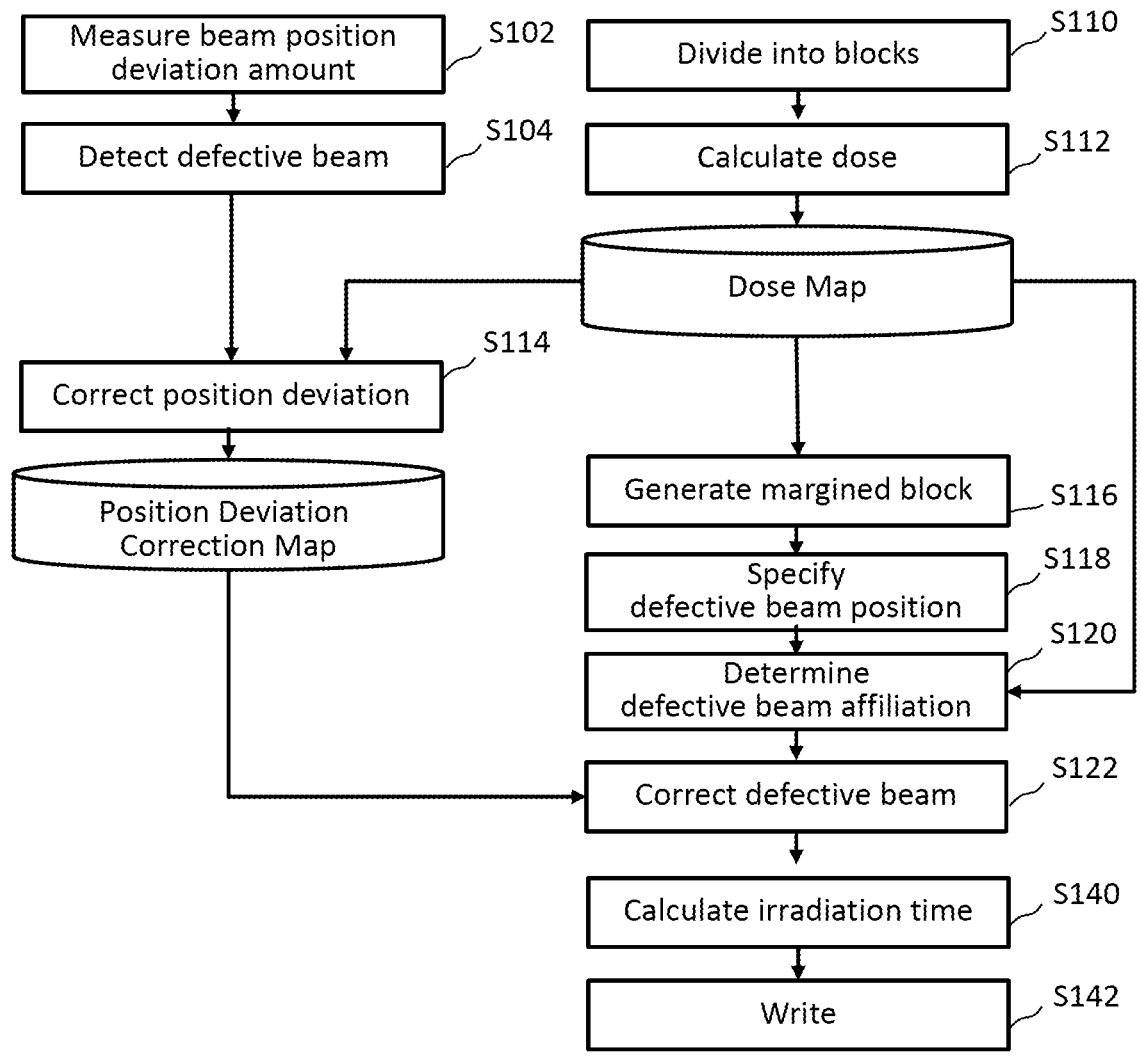
FIG. 7 is a flowchart showing main steps of a writing method according to the first embodiment.

FIG. 7 is a flowchart showing main steps of a writing method according to the first embodiment. In FIG. 7, the writing method of the first embodiment executes a series of steps: a beam position deviation amount measuring step (S102), a defective beam detecting step (S104), a dividing step into blocks (S110), a dose calculating step (S112), a position deviation correcting step (S114), a margined block generating step (S116), a defective beam position specifying step (S118), a defective beam affiliation determining step (S120), a defective beam correcting step (S122), an irradiation time calculating step (S140), and a writing step (S142).

In the beam position deviation amount measuring step (S102), the writing apparatus 100 measures a position deviation amount of an irradiation position of each beam of the multiple beams 20 deviating from a corresponding control grid 27 on the target object 101.

Figure 8B:
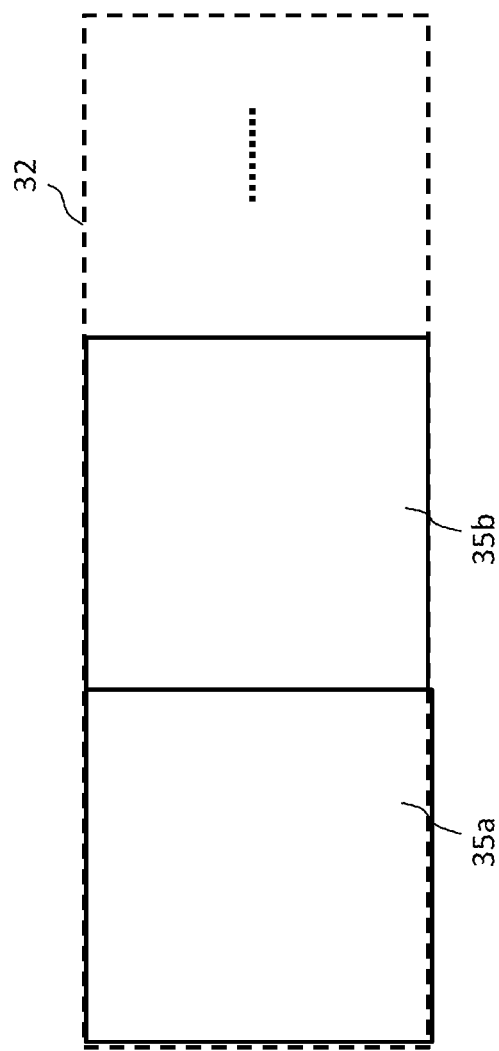
FIGS. 8A and 8B show a beam position deviation and a position deviation periodicity according to the first embodiment.
Figure 8A:
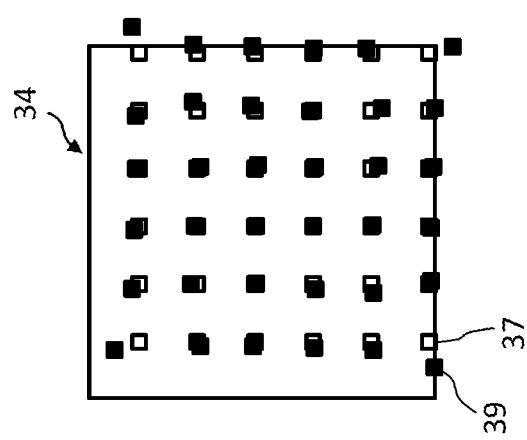

FIGS. 8A and 8B illustrate a beam position deviation and a position deviation periodicity according to the first embodiment. In the multiple beams 20, as shown in FIG. 8A, distortion occurs in an exposure field due to optical system characteristics, and therefore, an actual irradiation position 39 of each beam deviates from an irradiation position 37 of the ideal grid because of the distortion. Then, according to the first embodiment, the amount of a position deviation of the actual irradiation position 39 of each beam is measured. Specifically, an evaluation substrate coated with resist is irradiated with the multiple beams 20, and the irradiated evaluation substrate is developed in order to generate a resist pattern. Then, the position of the generated resist pattern is measured by a position measuring instrument so as to measure a position deviation amount of each beam. If it is difficult to measure the size of the resist pattern at the irradiation position of each beam by a position measuring instrument since the shot size of the beam concerned is small, it should perform to write a figure pattern (e.g., rectangular pattern) of measurable size by a position measuring instrument, measure edge positions of the both sides of the figure pattern (resist pattern), and measure a position deviation amount of a target beam based on a difference between the intermediate position between the both edges and the intermediate position of a figure pattern in design. Then, obtained position deviation amount data on each beam irradiation position is input into the writing apparatus 100, and stored in the storage device 144. Further, in the multi-beam writing, in the case of the writing sequence explained in FIG. 6, for example, since writing proceeds while shifting the irradiation region 34 in the stripe region 32, periodicity occurs in position deviation of each beam every time the irradiation region 34 is moved because the position of the irradiation region 34 moves one by one, such as from the irradiation region 34a to 34o, during writing of the stripe region 32 as shown in the lower part of FIG. 4. Alternatively, in the case of the writing sequence where each beam irradiates all of the pixels 36 in the sub irradiation region 29 corresponding to the beam concerned, as shown in FIG. 8B, periodicity occurs at least in the position deviation of each beam in each unit region 35 (35a, 35b, having the same size as the irradiation region 34. Therefore, if the position deviation amount of each beam for one irradiation region 34 is measured, the measurement result can also be used for other regions. In other words, it is sufficient to measure a position deviation amount at each pixel 36 in the sub irradiation region 29 corresponding to each beam.

The beam-position deviation map generation unit 56 generates a beam-position deviation map (1) which defines a position deviation amount of each beam per beam array, that is, each beam in the irradiation region 34. Specifically, the beam-position deviation map generation unit 56 reads position deviation amount data on the irradiation position of each beam from the storage device 144, and generates the beam-position deviation map (1) by using the data as a map value.

Next, the beam-position deviation map generation unit 56 generates a beam-position deviation map (2) for the control grid 27 of each pixel 36 in the stripe region 32. Which beam irradiates the control grid 27 of each pixel 36 in the stripe region 32 is determined based on the writing sequence as described with reference to FIG. 6, for example. Therefore, for each control grid 27 of each pixel 36 in the stripe region 32, the beam-position deviation map generation unit 56 specifies a beam to irradiate the control grid 27 concerned according to the writing sequence, and calculates a position deviation amount of the beam concerned. The beam-position deviation map generation unit 56 generates the beam-position deviation map (2) for each stripe by using the amount of a position deviation of the irradiation position of a beam to each control grid 27, as a map value. As described above, since periodicity occurs in the position deviation of each beam, the beam-position deviation map (2) for each stripe can be generated by using a value of the beam-position deviation map (1) for each beam array. The generated beam-position deviation map (2) is stored in the storage device 144.

In the defective beam detecting step (S104), the detection unit 60 detects a defective beam in the multiple beams 20. As the defective beam, exemplified are an excessive dose defective beam which delivers an excessive dose irradiation since controlling the beam dose is disabled, and an insufficient dose defective beam which delivers an insufficient dose irradiation since controlling the beam dose is disabled. Excessive dose defective beams include ON defective beams which are "always ON", and a part of uncontrollable defective beams whose irradiation time control is uncontrollable. Insufficient dose defective beams include OFF defective beams which are "always OFF", and the remaining of the uncontrollable defective beams. The ON defective beam being "always ON" performs all the time an irradiation of the maximum irradiation time Ttr, which is maximum in one shot, regardless of the control dose. Furthermore, it continues the irradiation also during moving from one pixel to another. The OFF defective beam being an "always OFF" is all the time "OFF" regardless of the control dose. Specifically, under the control of the writing control unit 74, the writing mechanism 150 individually controls each of the multiple beams 20 to be "ON" one by one by the individual blanking mechanism, and all of the remaining beams, except for the "ON" beams, to be "OFF". In this state, if there is a beam whose current is not detected by the Faraday cup 106, it is detected as an OFF defective beam. Then, the control is switched from this state to a state in which a target beam to be detected is an "OFF" beam. In that case, if there is a beam whose current is detected by the Faraday cup 106 all the time, in spite of having been switched from an "ON" beam to an "OFF" beam to be detected, it is detected as an ON defective beam. If there is a beam whose current is detected by the Faraday cup 106 during a predetermined period, after having been switched from an "ON" beam to an "OFF" beam to be detected, it is detected as an uncontrollable defective beam. By checking each of the multiple beams 20 in order by the same method, it is possible to detect whether there is a defective beam or not, and where a defective beam is located.

The dose d' of an ON defective beam being "always ON" can be defined by the following equation (1) using a shot cycle Tsc (time) and a current density J. The shot cycle Tsc can be defined by a maximum irradiation time Ttr per shot of the multiple beams 20. It is also preferable that the maximum irradiation time Ttr per shot includes a switching time needed for switching a pixel to be beam-irradiated to another, a settling time for beam deflection, and a data transmission time.

$$d' = j \cdot Tsc \qquad (1)$$

The dose of an uncontrollable defective beam which is "beam ON" only during a predetermined period can be obtained using a time period of the "beam ON" instead of the shot cycle Tsc of the equation (1). Information on a detected defective beam is stored in the storage device 144.

In the block dividing step into blocks (S110), the dividing unit 50 divides the writing region of the target object 101 into a plurality of block regions.

Figure 9:
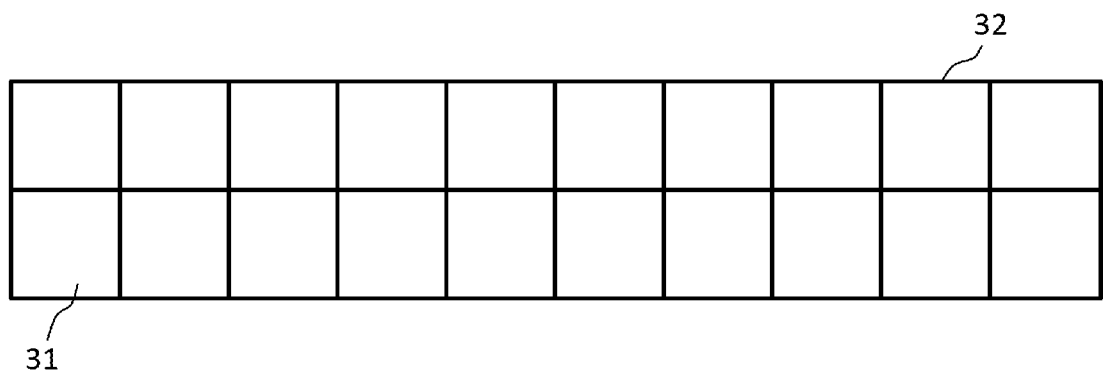
FIG. 9 shows an example of a block region according to the first embodiment.

FIG. 9 shows an example of a block region according to the first embodiment. FIG. 9 shows the case where, as a writing region, each stripe region 32 is divided into a plurality of block regions 31. Each block region 31 is preferably set to be smaller than the irradiation region 34, and larger than the sub irradiation region 29. The block region 31 serves as a unit region to perform data processing for writing.

In the dose calculating step (S112), first, the plurality of rasterization units 52 (52a, 52b, ...) perform rasterization processing simultaneously or in parallel in two or more ones in the plurality of block regions 31. Specifically, each rasterization unit 52 reads writing data of an associated block region 31 from the storage device 140, and calculates, for each pixel 36, a pattern area density ρ' in the pixel 36 concerned.

Next, the plurality of dose calculation units 54 (54a, 54b, ...) (dose data generation unit) generate data on a dose at each position in the writing region of the target object 101. Specifically, the plurality of dose calculation units 54 (54a, 54b, ...) (dose data generation unit) in parallel generate data on the dose at each position in each block region 31 in two or more ones of the plurality of block regions 31. Thus, the plurality of dose calculation units 54 generate data on the dose at each position in a block region 31 different from other block regions 31 in which other dose calculation units 54 perform generation, in the plurality of block regions 31. The writing region (here, for example, stripe region 32) is virtually divided into a plurality of proximity mesh regions (mesh regions for proximity effect correction calculation) by a predetermined size. The size of the proximity mesh region is preferably about 1/10 of the influence range of the proximity effect, such as about 1 μm. Each dose calculation unit 54 reads writing data of an associated block region 31 from the storage device 140, and calculates, for each proximity mesh region, a pattern area density ρ of a pattern arranged in the proximity mesh region concerned.

Next, each dose calculation unit 54 calculates, for each proximity mesh region, a proximity-effect correction irradiation coefficient $D_p(x)$ (correction dose) for correcting a proximity effect. An unknown proximity-effect correction irradiation coefficient $D_p(x)$ can be defined by a threshold value model for proximity-effect correction, which is the same as the one used in a conventional method, where a backscatter coefficient η, a dose threshold value Dth of a threshold value model, a pattern area density ρ, and a distribution function g(x) are used.

Next, each dose calculation unit 54 calculates, for each pixel 36 of an associated block region 31, an incident dose D(x) (dose amount) with which the pixel 36 concerned is irradiated. The incident dose D(x) can be calculated, for example, by multiplying a pre-set base dose $D_{base}$, a proximity effect correction irradiation coefficient $D_p$, and a pattern area density η'. The base dose $D_{base}$ can be defined by Dth/(½+η), for example. Thereby, it is possible to obtain an originally desired incident dose D(x), for which the proximity effect has been corrected, based on layout of a plurality of figure patterns defined by the writing data.

Each dose calculation unit 54 generates a dose map defining an incident dose D(x) for each pixel 36 of an associated block region 31. Such incident dose D(x) for each pixel 36 serves as a designed incident dose D(x) with which the control grid 27 of the pixel 36 concerned is to be irradiated. The generated dose map is stored, for each stripe region 31, in the storage device 142, for example. Although each block region 31 is here used as a processing region of dose calculation, it is not limited thereto. It is also preferable to use another plurality of block regions (not shown) (first block region) obtained by dividing the writing region of the target object 101. In other words, the block region (first block region) used for dose calculation, and the block region 31 (second block region) used for position deviation correction and defective beam correction to be described later may be the same as each other, or different from each other (that is, the first block region differs from the second one).

In the position deviation correcting step (S114), the plurality of position deviation correction units 58 (58a, 58b, . . . ) in parallel correct an irradiation pattern position deviation due to a beam position deviation in an associated block region 31 in two or more ones of the plurality of block regions 31. Specifically, each position deviation correction unit 58 calculates, for each pixel 36 in an associated block region 31, a dose modulation rate (first dose modulation rate) of a beam to the pixel 36 concerned for correcting an irradiation pattern position deviation resulting from a position deviation of a beam delivered to the pixel 36 concerned in accordance with a writing sequence, and a dose modulation rate (second dose modulation rate) for delivering a dose to at least one peripheral pixel surrounding the pixel concerned.

FIGS. 10A and 10B illustrate an example of a method for correcting a position deviation according to the first embodiment. FIG. 10A shows the case where a beam "a'" irradiating the pixel at coordinates (x, y) deviates in the −x and −y directions. In order to correct the deviated position of the pattern formed by the beam "a'" with such position deviation to the position corresponding to the pixel at coordinates (x, y) as shown in FIG. 10B, correction can be accomplished by distributing the dose amount corresponding to the deviated position to a pixel located opposite to the direction of deviated peripheral pixels. In the example of FIG. 10A, the dose amount corresponding to the position deviated to the pixel at coordinates (x, y−1) should be distributed to the pixel at coordinates (x, y+1). The dose amount corresponding to the position deviated to the pixel at coordinates (x−1, y) should be distributed to the pixel at coordinates (x+1, y). The dose amount corresponding to the position deviated to the pixel at coordinates (x−1, y−1) should be distributed to the pixel at coordinates (x+1, y+1).

In proportion to a ratio of the area displaced due to a position deviation of the beam to the pixel concerned, each position deviation correction unit 58 calculates a dose modulation rate of a beam to the pixel concerned, and a dose modulation rate of a beam to at least one peripheral pixel surrounding the pixel concerned. Specifically, for each peripheral surrounding pixel where a part of beams are overlapped due to a beam deviation, the ratio obtained by dividing the deviated area (area of beam overlapping portion) by the beam area is calculated as an amount of distribution (beam dose modulation rate) to a pixel located opposite to the overlapping pixel.

In the case of FIG. 10A, the area ratio of the portion shifted (displaced) to the pixel at coordinates (x, y−1) can be calculated by ("beam size in x direction"−"deviation amount in −x direction")×"deviation amount in y direction"/("beam size in x direction"×"beam size in y direction"). Therefore, a distribution amount (beam dose modulation rate) V to be distributed for correction to the pixel at coordinates (x, y+1) can be calculated by ("beam size in x direction"−"deviation amount in −x direction")×"deviation amount in y direction"/("beam size in x direction"×"beam size in y direction").

Also, in the case of FIG. 10A, the area ratio of the portion shifted (displaced) to the pixel at coordinates (x−1, y−1) can be calculated by "deviation amount in −x direction"×"deviation amount in −y direction"/("beam size in x direction"×"beam size in y direction"). Therefore, a distribution amount (beam dose modulation rate) W to be distributed for correction to the pixel at coordinates (x+1, y+1) can be calculated by "deviation amount in −x direction"×"deviation amount in −y direction"/("beam size in x direction"×"beam size in y direction").

Also, in the case of FIG. 10A, the area ratio of the portion shifted (displaced) to the pixel at coordinates (x−1, y) can be calculated by "deviation amount in −x direction"×("beam size in y direction"−"deviation amount in −y direction"/("beam size in x direction"×"beam size in y direction"). Therefore, a distribution amount (beam dose modulation rate) Z to be distributed for correction to the pixel at coordinates (x+1, y) can be calculated by "deviation amount in −x direction"×("beam size in y direction"−"deviation amount in −y direction"/("beam size in x direction"×"beam size in y direction").

Consequently, the dose modulation rate U of the beam irradiating the pixel at coordinates (x, y), which remains without being distributed, can be calculated by 1-V-W-Z.

As described above, for each pixel, the dose modulation rate of the beam to the pixel concerned, and the dose modulation rate of the beam to at least one peripheral pixel serving as a distribution destination are calculated.

Next, the dose map generation unit 62 reads the dose map of before correcting position deviation stored in the storage device 142, defines, for each pixel in an associated block region 31, a value obtained by multiplying its own dose by its own dose modulation rate, and distributes, to a pixel at a distribution destination, a value obtained by multiplying its own dose by a dose modulation rate of the beam to the distribution destination. A dose with respect to which a position deviation has been corrected is defined for each pixel by adding a value distributed from other pixel to a value obtained by multiplying its own dose by its own dose modulation rate. Thereby, a dose map (position deviation correction dose map) of after correcting position deviation is generated. The generated position deviation correction dose map is stored in the storage device 142. Although each block region 31 is here used as a processing region for position deviation correction, it is not limited thereto. Another plurality of block regions (not shown) (third block region) acquired by dividing the writing region of the target object 101 may also be used. That is, the block region 31 (second block region) used for correction of defective beams to be described later may be the same as the block region (third block region) used for correction of position deviation, or they (second and third block regions) may be different from each other.

In the margined block generating step (S116), the margined block generation unit 64 (margined block region generation unit) generates a plurality of margined block regions formed by adding a margin region to the periphery of each of a plurality of block regions 31.

Figures 11A, 11B:
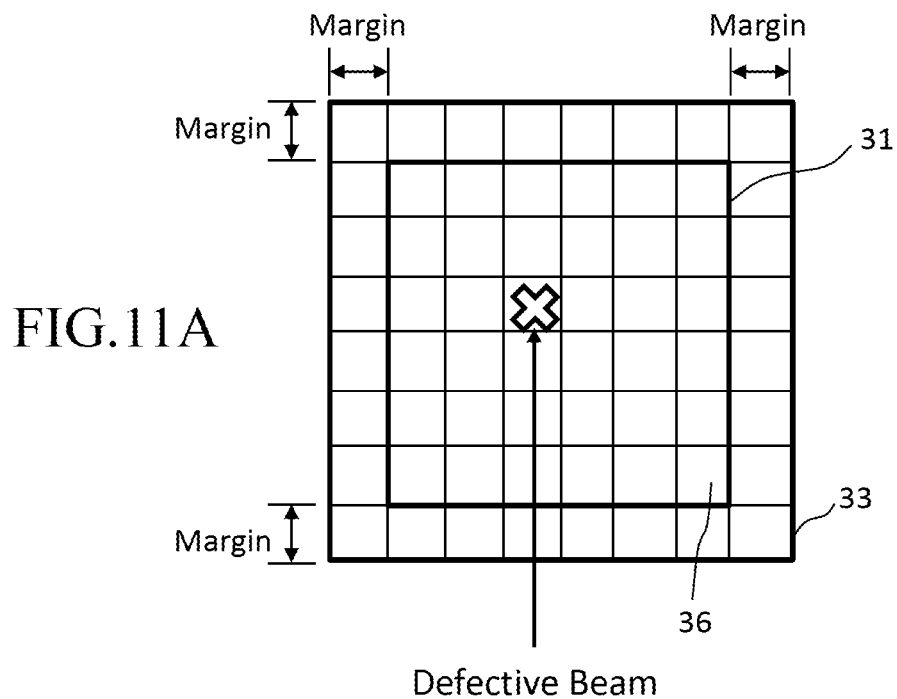
FIGS. 11A and 11B show an example of a block region with a margin, and each sub region in a margined block region according to the first embodiment.

FIGS. 11A and 11B show an example of a block region with a margin, and each sub region in the margined block region according to the first embodiment. The example of FIG. 11A shows a margined block region 33 where a region corresponding to, for example, one pixel 36 is added as a margin region to the periphery of each block region 31. The margin region added is not limited to the region corresponding to one pixel 36, and may be a region corresponding to two pixels, three pixels and so on. Here, since the margin region is used for correcting a defective beam, the region added is preferably a pixel unit for which the dose is defined.

In the defective beam position specifying step (S118), the specifying unit 66 specifies, for each detected defective beam, the pixel irradiated with the defective beam concerned. The beam to irradiate each pixel is determined based on a writing sequence. Accordingly, the position of the pixel to be irradiated with a defective beam is specified for each margined block region 33. Needless to say, the margined block region 33 in which there is no pixel irradiated with a defective beam may also exist.

In the defective beam affiliation determining step (S120), based on conditions set according to a region, in a plurality of sub regions "a" to "f" (sub-block regions) acquired by dividing the margined block region 33, in which the position irradiated with a defective beam is located, the affiliation determination unit 68 determines one of the plurality of margined block regions 33 to which the pixel (position) irradiated with a defective beam in the multiple beams 20 belongs. With respect to the plurality of margined block regions 33, since the margin region has been added, portions of adjacent margined block regions 33 overlap with each other. According to the first embodiment, each pixel irradiated with a defective beam is made to belong to any one of the plurality of margined block regions 33.

As shown in FIG. 11B, each pixel in each margined block region 33 is classified into either of the sub regions "a" to "f". The sub region "a" is defined by the region located at the inner side of the peripheral pixels along inside the original block region 31. The sub region "b" is defined by four regions except for pixels at the four corners in the peripheral pixels along inside the original block region 31. The sub region "c" is defined, in the margin region, by four regions except for pixels at the four corners and pixels each adjacent to one of the pixels at the four corners. The sub region "d" is defined by the pixels at the four corners in the original block region 31. The sub region "e" is defined, in the margin region, by eight pixels each longitudinally or laterally adjacent to the pixels at the four corners. The sub region "f" is defined, in the margin region, by the pixels at the four corners.

Figures 12, 13:
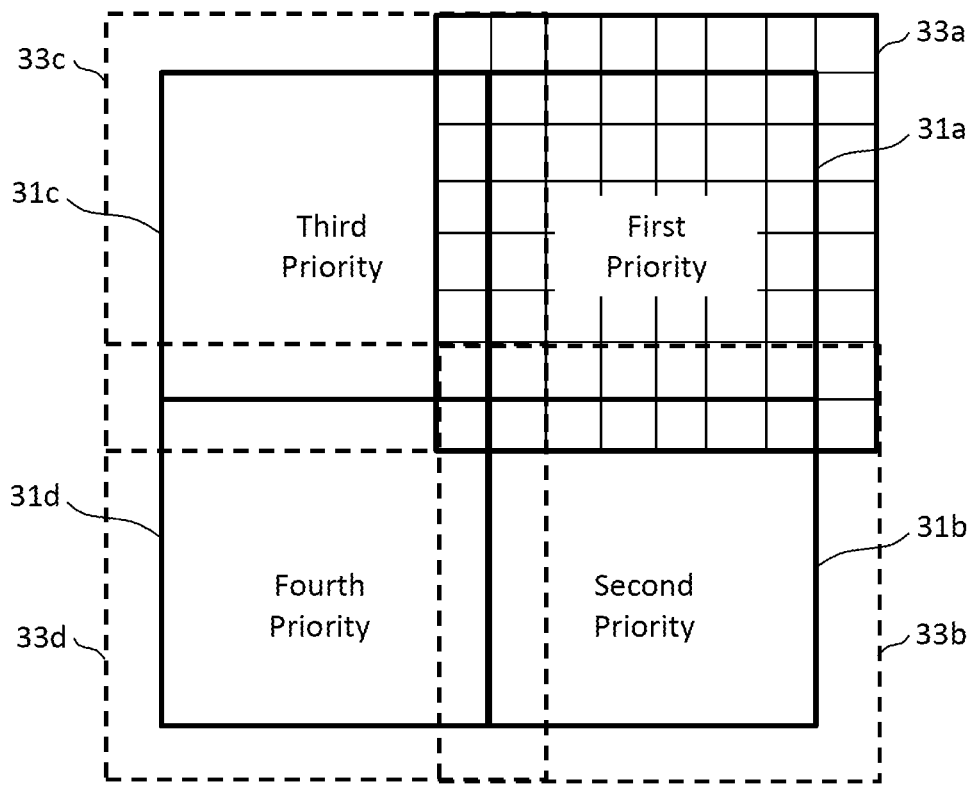
FIG. 12 shows an example of affiliation conditions (criteria) according to the first embodiment.
FIG. 13 shows an example of priority of four adjacent margined block regions according to the first embodiment.

FIG. 12 shows an example of affiliation conditions (criteria) according to the first embodiment. As shown in FIG. 12, when the position of the pixel irradiated with a defective beam is in the sub region "a", it is determined to affiliate the pixel irradiated with the defective beam to the margined block region 33 concerned.

In the case where the position of the pixel irradiated with a defective beam is in the sub region "b", when the dose at each pixel in the sub region "b" in which the pixel irradiated with the defective beam is included is zero in the four sub regions "b", and the dose at each pixel in the adjacent sub region "c" is not zero, it is determined to affiliate the pixel irradiated with the defective beam to the margined block region 33 concerned.

In the case where the position of the pixel irradiated with a defective beam is in the sub region "c", when the dose at each pixel in the sub region "c" in which the pixel irradiated with the defective beam is included is zero in the four sub regions "c", and the dose at each pixel in the adjacent sub region "b" is not zero, it is determined to affiliate the pixel irradiated with the defective beam to the margined block region 33 concerned.

In the case where the position of the pixel irradiated with a defective beam is in the sub region "d", when the dose at the pixel in the sub region "d" irradiated with the defective beam is not zero in the four sub regions "d", it is determined to affiliate the pixel irradiated with the defective beam to the margined block region 33 concerned.

In the case where the position of the pixel irradiated with a defective beam is in the sub region "e", when the dose at the pixel in the sub region "e" irradiated with the defective beam is zero in the eight sub regions "e", the dose at the pixel in the adjacent sub region "d" is larger than that in the adjacent sub region "f", and the dose at the pixel in the adjacent sub region "d" is larger than that in the diagonally adjacent sub region "e" (the sub region "e" symmetrically located), it is determined to affiliate the pixel irradiated with the defective beam to the margined block region 33 concerned.

In the case where the position of the pixel irradiated with a defective beam is in the sub region "f", when the dose at the pixel in the sub region "f" irradiated with the defective beam is zero in the four sub regions "f", the dose at the pixel in the adjacent sub region "d" is larger than that in one of the two adjacent sub regions "e", and the dose at the pixel in the adjacent sub region "d" is also larger than that in the other one of the two adjacent sub regions "e", it is determined to affiliate the pixel irradiated with the defective beam to the margined block region 33 concerned.

The affiliation determination unit 68 acquires a dose amount used for the conditions described above from data on the dose amount at each position where a position deviation of an irradiation pattern resulting from a position deviation of the irradiation position of the multiple beams 20 is not corrected, so as to determine a margined block region to which the position irradiated with a defective beam belongs. Specifically, a value defined in the dose map of before correcting position deviation is used as the dose at each pixel used under the conditions described above. By using the dose map of before correcting position deviation, the affiliation determination processing can be performed without waiting for position deviation correction processing. Therefore, the processing time period up to the final data processing can be accelerated.

FIG. 13 shows an example of priority of four adjacent margined block regions according to the first embodiment. As shown in FIG. 13, since 2×2 margined block regions overlap with each other, targets of affiliation determination with respect to the pixel irradiated with a defective beam are 2×2 (four) margined block regions 33a to 33d at the maximum. In such a case, it may possibly be determined that the pixel irradiated with a defective beam belongs to two or more margined block regions 33. In that case, the affiliation determination unit 68 determines the margined block region 33 to which the pixel irradiated with the defective beam belongs, while giving priority in order of the upper right margined block region 33a, the lower right margined block region 33b, the upper left margined block region 33c, and the lower left margined block region 33d. The order of the priority is not limited to the example of FIG. 13, and it may be set in advance.

In the defective beam correcting step (S122), the defective beam correction unit 70 calculates a correction dose at at least one pixel (position) for correcting a dose abnormality (irregularity) resulting from a defective beam, by using data on the dose at each pixel 36 in the block region 31 in the margined block region 33 to which the pixel (position) irradiated with the defective beam belongs, without referring to data on the dose in other block regions 31 corresponding to the margined block regions 33 different from the margined block region 33 to which the pixel (position) irradiated with the defective beam belongs. It is preferable to use pixels in the block region 31 except for the margin, as the pixel used for correcting a dose abnormality (irregularity) in the case where the pixel irradiated with a defective beam is possibly located in the margin and the pixel used for correction calculation except for the pixel irradiated with a defective beam. Although the defective beam correction is in many cases performed such that the gravity center position of the irradiation position of a defective beam is not changed as will be described later, when a pixel in the block region 31 is used for correction, it may be difficult to perform the correction without changing the center of gravity position. In that case, it is also acceptable to perform the correction such that the center of gravity position is moved to the block region 31 side as will be described later. The dose at each pixel used in this case is, unlike the case of affiliation determination, a value defined in the dose map of after position deviation correction. The method for correcting a dose abnormality (irregularity) resulting from a defective beam may be the same as the conventional one. For example, there can be cited the following method.

Figure 14:
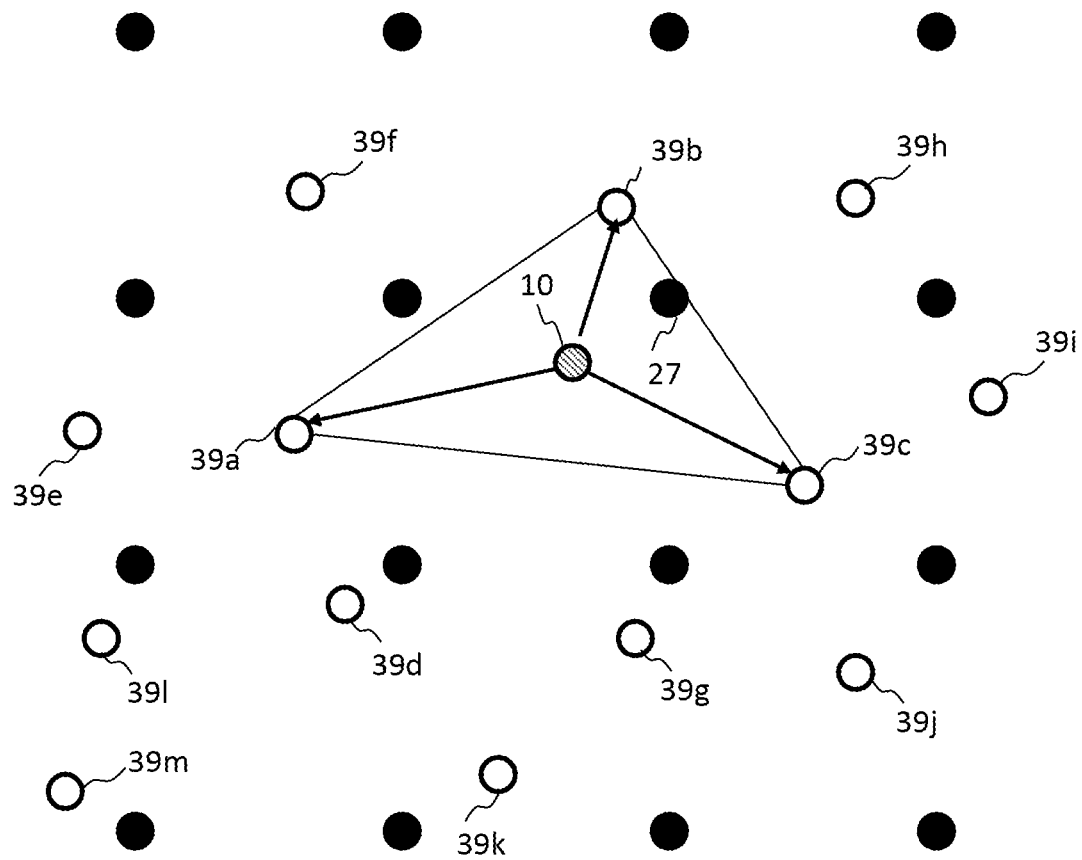
FIG. 14 shows an example of a method for correcting a defective beam according to the first embodiment.

FIG. 14 illustrates an example of a method for correcting a defective beam according to the first embodiment. FIG. 14 shows the case where the pixel irradiated with an excessive dose defective beam 10 is located in, for example, the sub region "a". Eleven beams (N=11) whose irradiation positions 39a to 39k are away from the irradiation position of the excessive dose defective beam 10 by, for example, two or less beam pitches are defined as peripheral beams. The pitch between beams may be a designed size. Correction can be performed by distributing an excessive dose amount, without changing the center of gravity position, to, for example, three peripheral beams 39a to 39c which are close to and surrounding the irradiation position of the excessive dose defective beam 10 (that is, the gravity center of the excessive dose defective beam 10). If the excessive dose amount still remains after such distribution, it may be distributed to one or more peripheral beams in the peripheral beams 39d to 39k.

Specifically, the amount of assigned dose is variable depending upon a distance ri from the irradiation position of the defective beam 10 to the irradiation position of a peripheral beam. i indicates the index of a peripheral beam being the target in the N peripheral beams. Each assigned dose δdi can be defined by the following equation (2) using an excessive dose Δ and a distance ri.

$$\delta d_i = \Delta \cdot \frac{1}{r_i} \bigg/ \sum \frac{1}{r_i} \qquad (2)$$

Then, the defective beam correction unit 70 calculates a correction dose by subtracting a corresponding assigned dose δdi from each dose D of these peripheral beams.

In contrast, in the case of an insufficient dose defective beam, a correction dose can be calculated by obtaining each assigned dose δdi by replacing the excessive dose Δ with an insufficient dose, and adding a corresponding assigned dose δdi to each dose D of these peripheral beams.

The defective beam correction method, which performs correction without moving the center of gravity position as shown in the example of FIG. 14, can be applied even to the case where a pixel irradiated with a defective beam is located in the sub region "b" or "d", for example. Further, if the margin region is set larger, the method may be applied even to the case where a pixel irradiated with a defective beam is located in the sub region "c", "e" or "f". However, when the pixel irradiated with a defective beam is located, for example, in the sub region "c", "e", or "f", or in the sub region "b" or "d", it may be difficult to correct the excessive dose or the insufficient dose without moving the center of gravity position. In such a case, even by daring to move the center of gravity position, an excessive dose or an insufficient dose is distributed to other pixel in the block region 31 in the margined block region 33 to which the pixel irradiated with a defective beam belongs located inner from the pixel irradiated with a defective beam. Since the dose not being zero is defined for a pixel located inner from the pixel irradiated with a defective beam, even when an excessive dose is distributed, the distributed excessive dose can be subtracted from the dose at the pixel which received the distribution. Although the correction accuracy may be somewhat reduced by moving the gravity center, the writing accuracy can be increased more than the case of no correction.

According to the first embodiment, since the pixel irradiated with a defective beam is made to belong to any one of the margined block regions 33, processing for the defective beam correction can be accomplished using data on the margined block region 33 made belonged. Therefore, it is not necessary to exchange data with other block regions 31. Thus, parallel processing can be performed efficiently.

In the irradiation time calculating step (S140), the irradiation time calculation unit 72 calculates an irradiation time t corresponding to the dose at each pixel with respect to which the beam position deviation has been corrected and the dose abnormality (irregularity) due to a defective beam has been corrected. The irradiation time t can be obtained by dividing the dose D by the current density j. The irradiation time t of each pixel 36 (control grid 27) is calculated as a value within the maximum irradiation time Ttr during which one shot of the multiple beams 20 can perform irradiation. The irradiation time data is stored in the storage device 142.

In the writing step (S142), first, the writing control unit 74 rearranges the irradiation time data in the order of shot in accordance with the writing sequence. Then, the irradiation time data is transmitted to the deflection control circuit 130 in the order of shot. The deflection control circuit 130 outputs deflection control signals to the DAC amplifier units 132 and 134 in the order of shot while outputting a blanking control signal to the blanking aperture array mechanism 204 in the order of shot. The writing mechanism 150 writes a pattern on the target object 101, using the multiple beams 20 in which doses at a plurality of positions used for correcting a dose abnormality (irregularity) have been controlled by correction doses.

As described above, according to the first embodiment, processing of correcting a defective beam can be performed without exchanging data between blocks. Therefore, data processing can be accelerated.

Second Embodiment

Although the first embodiment describes a configuration in which affiliation of the pixel irradiated with a defective beam is determined using a dose map of before correcting position deviation, it is not limited thereto. A second embodiment describes a configuration in which affiliation of the pixel irradiated with a defective beam is determined using a dose map of after correcting position deviation. The configuration of the writing apparatus 100 in the second embodiment is the same as that of FIG. 1. Further, the contents of the second embodiment are the same as those of the first embodiment except for what is particularly described below.

Figure 15:
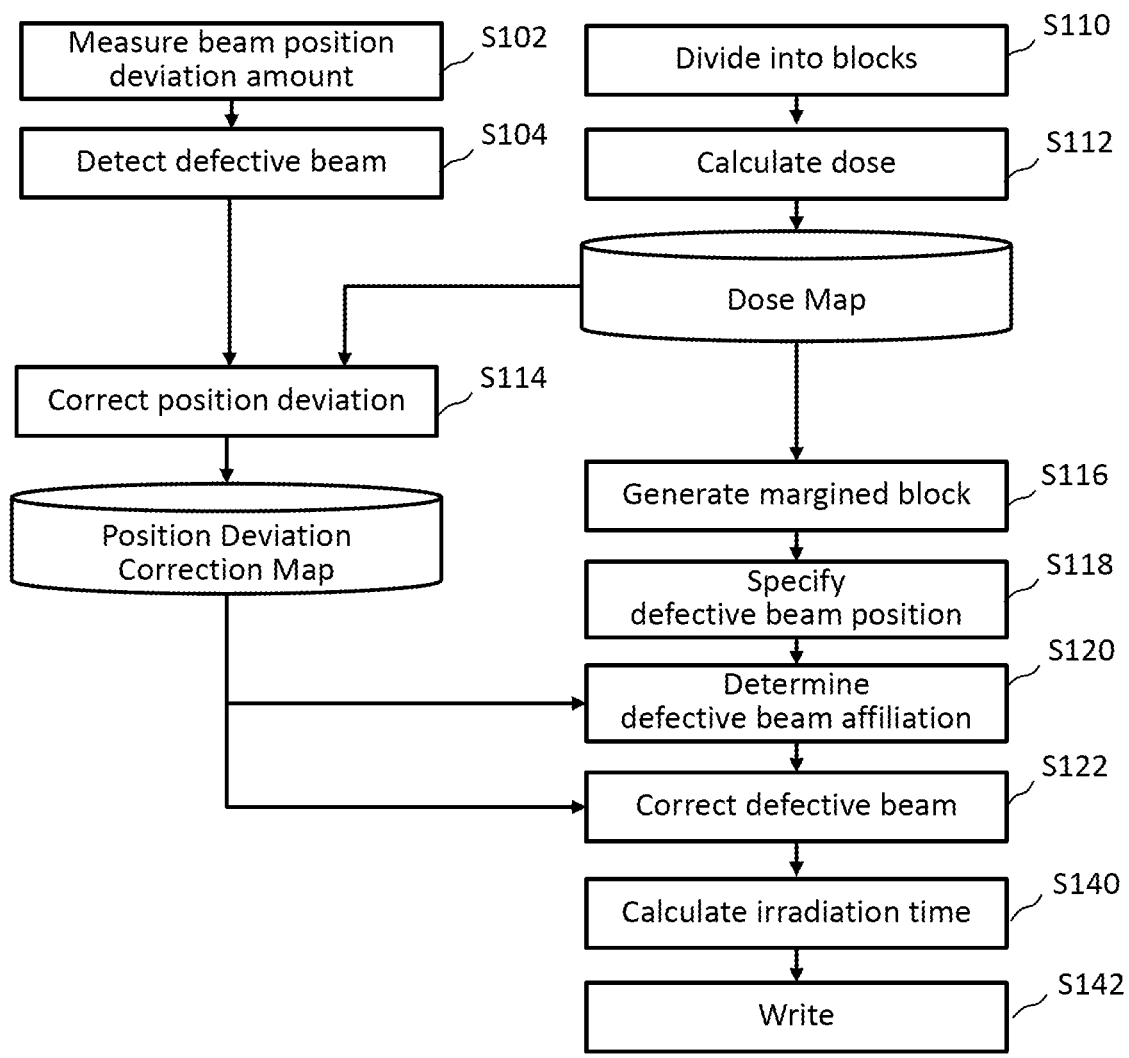
FIG. 15 is a flowchart showing main steps of a writing method according to a second embodiment.

FIG. 15 is a flowchart showing main steps of a writing method according to the second embodiment. The contents shown in FIG. 15 are the same as those in FIG. 7 except for the arrow indicating that the dose map used for the defective beam affiliation determining step (S120) is a position deviation correction dose map.

The contents of each of the beam position deviation amount measuring step (S102), the defective beam detecting step (S104), the dividing step into blocks (S110), the dose calculating step (S112), the position deviation correcting step (S114), the margined block generating step (S116), and the defective beam position specifying step (S118) are the same as those of the first embodiment.

In the defective beam affiliation determining step (S120), the affiliation determination unit 68 acquires a dose to be used for the conditions described above from the dose data (dose map of after position deviation correction) where deviation of irradiation positions of respective positions in the margined block region 33 to which the position irradiated with the defective beam may belong has been corrected, and determines a margined block region to which the position irradiated with the defective beam is made to belong. The other contents are the same as those of the first embodiment. By using the dose map of after correcting position deviation, affiliation determination can be performed using data close to a dose to be actually emitted. Therefore, the accuracy of the affiliation determination can be improved.

When the dose map of after position deviation correction is used, it is necessary that the position deviation correction processing has been completed for all the block regions 31. In that case, affiliation determination processing may be rate-controlled by the position deviation correcting step (S114). Then, since the pixel irradiated with a defective beam is specified, any one of a plurality of position deviation correction units 58 may precedently perform position deviation correction processing with respect to the block region 31 including the pixel irradiated with a defective beam and its adjacent block region 31. Alternatively, it is also preferable that any one of a plurality of position deviation correction units 58 precedently performs position deviation correction processing for the margined block region 33 including the pixel irradiated with a defective beam. In that case, position deviation correction processing simpler than the one described above may be performed.

The contents of each of the defective beam correcting step (S122), the irradiation time calculating step (S140), and the writing step (S142) are the same as those of the first embodiment.

Third Embodiment

Although the first and second embodiments describe a configuration in which a defective beam is corrected after affiliating each pixel irradiated with a defective beam to a corresponding margined block region 33, it is not limited thereto. A third embodiment describes a configuration in which defective beam correction may be redundantly performed.

Figure 16:
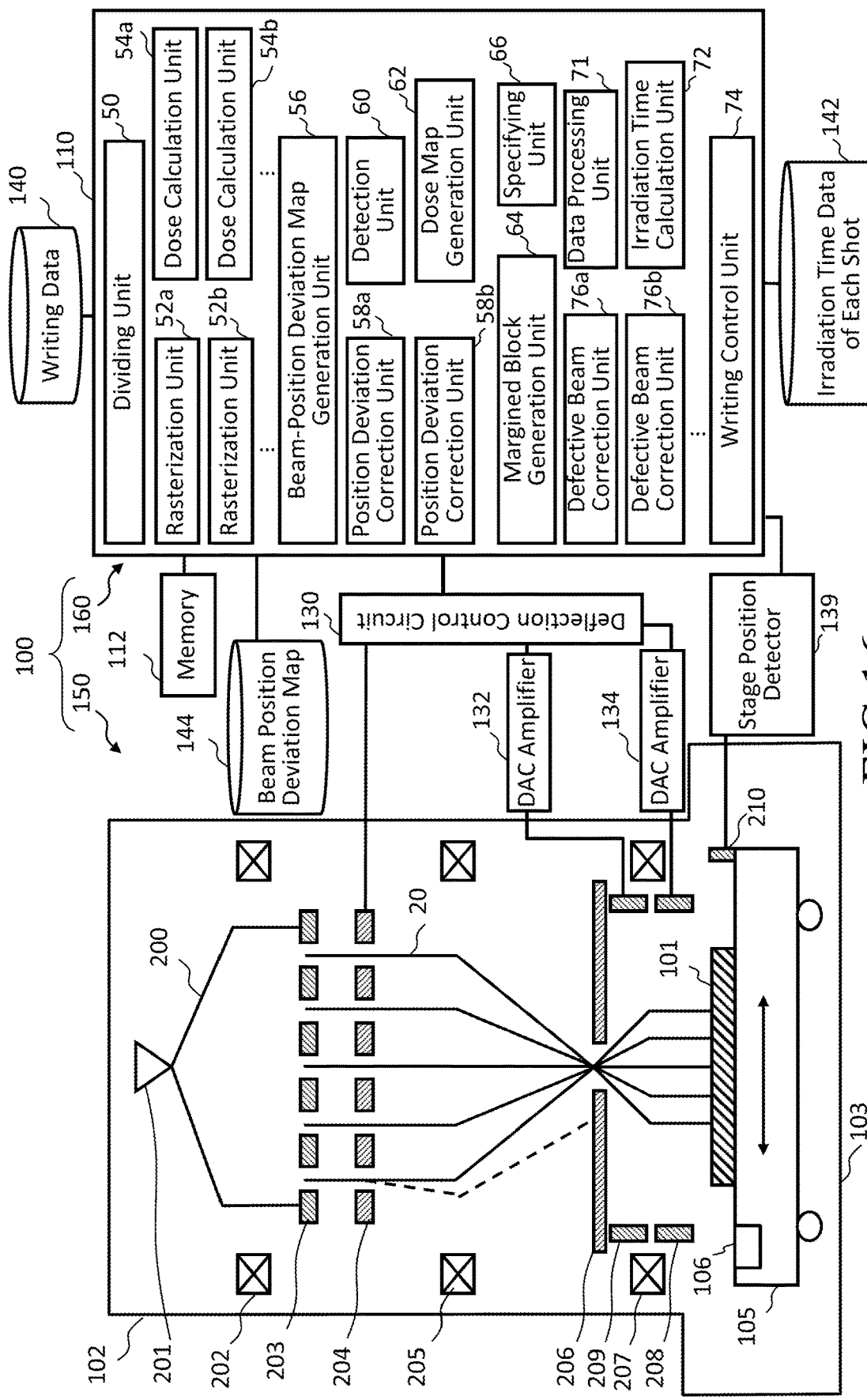
FIG. 16 is a conceptual diagram showing a configuration of a writing apparatus according to a third embodiment.

FIG. 16 is a conceptual diagram showing a configuration of a writing apparatus according to the third embodiment. FIG. 16 is the same as FIG. 1 except for that a data processing unit 71 and a plurality of defective beam correction units 76 (76a, 76b, ... ), are disposed in the control computer 110, instead of the affiliation determination unit 68 and the defective beam correction unit 70. Each of the "units" such as the dividing unit 50, the plurality of rasterization units 52 (52a, 52b, ... ), the plurality of dose calculation units 54 (54a, 54b, ... ), the beam-position deviation map generation unit 56, the plurality of position deviation correction units 58 (58a, 58b, ... ), the detection unit 60, the dose map generation unit 62, the margined block generation unit 64, the specifying unit 66, the plurality of defective beam correction units 76 (76a, 76b, ... ), the data processing unit 71, the irradiation time calculation unit 72, and the writing control unit 74 includes processing circuitry. As the processing circuitry, for example, an electric circuit, computer, processor, circuit board, quantum circuit, or semiconductor device can be used. Each " . . . unit" may use common processing circuitry (the same processing circuitry), or different processing circuitry (separate processing circuitry). Information input/output to/from the dividing unit 50, the plurality of rasterization units 52 (52a, 52b, ... ), the plurality of dose calculation units 54 (54a, 54b, ... ), the beam-position deviation map generation unit 56, the plurality of position deviation correction units 58 (58a, 58b, ... ), the detection unit 60, the dose map generation unit 62, the margined block generation unit 64, the specifying unit 66, the plurality of defective beam correction units 76 (76a, 76b, ... ), the data processing unit 71, the irradiation time calculation unit 72, and the writing control unit 74, and information being operated are stored in the memory 112 each time.

Figure 17:
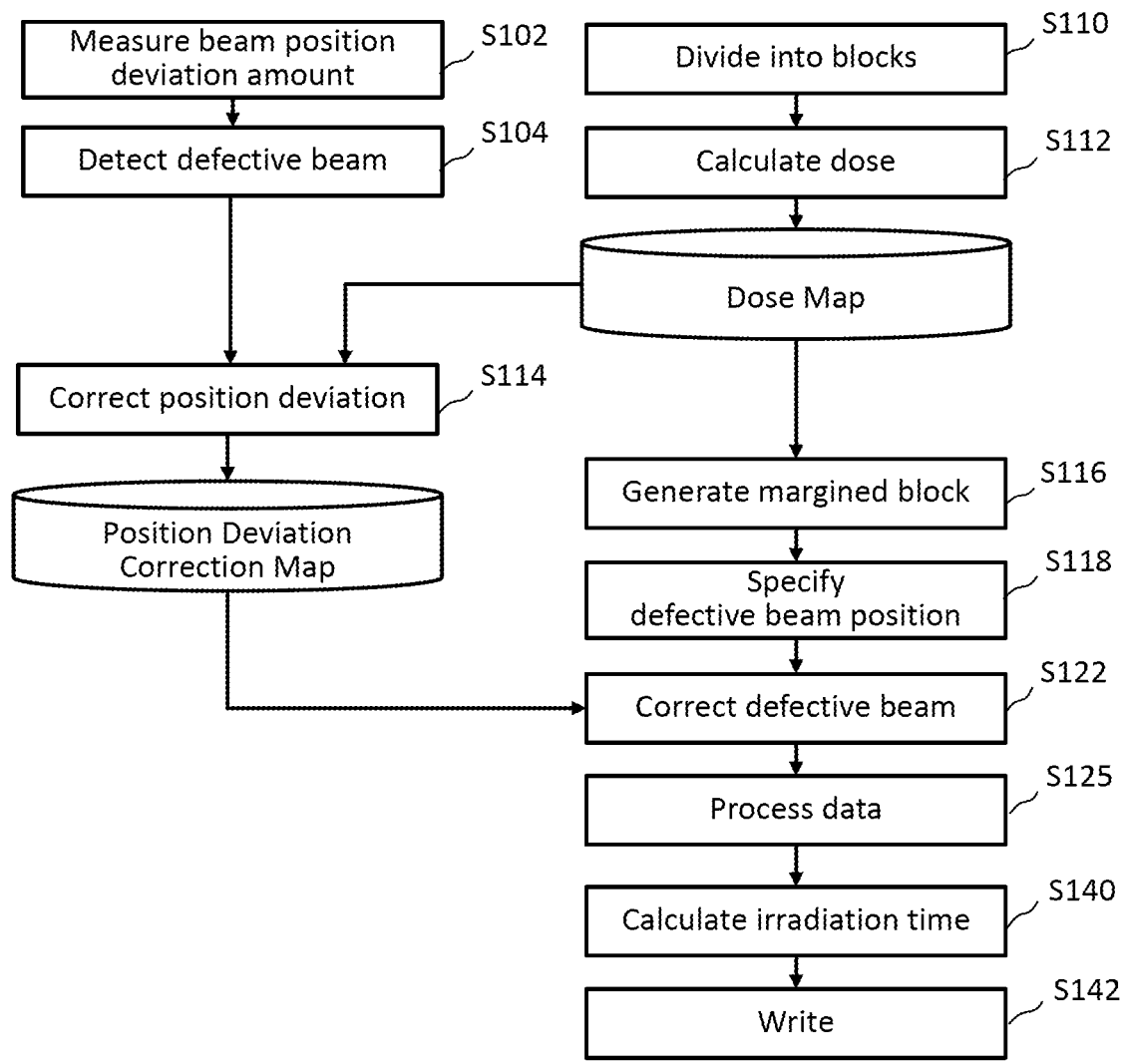
FIG. 17 is a flowchart showing an example of main steps of a writing method according to the third embodiment.

FIG. 17 is a flowchart showing an example of main steps of a writing method according to the third embodiment. FIG. 17 is the same as FIG. 7 except for that the defective beam affiliation determining step (S120) is removed, and the data processing step (S125) is executed.

The contents of each step of the beam position deviation amount measuring step (S102), the defective beam detecting step (S104), the dividing step into blocks (S110), the dose calculating step (S112), the position deviation correcting step (S114), the margined block generating step (S116), and the defective beam position specifying step (S118) are the same as those of the first embodiment.

In the margined block generating step (S116), the size of the margin region is preferably one of twice a beam size and more than twice the beam size. For example, preferably, it is set to be twice to four times the beam size. The margin size includes a portion for beam blurring and beam position deviation.

Figure 18A:
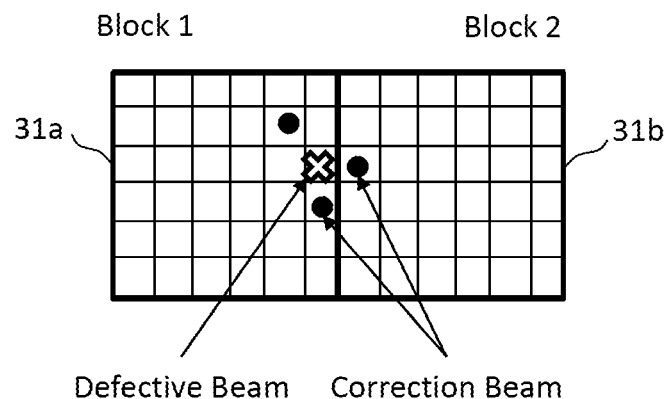
FIGS. 18A and 18B show a method for correcting a defective beam according to the third embodiment.
Figure 18B:
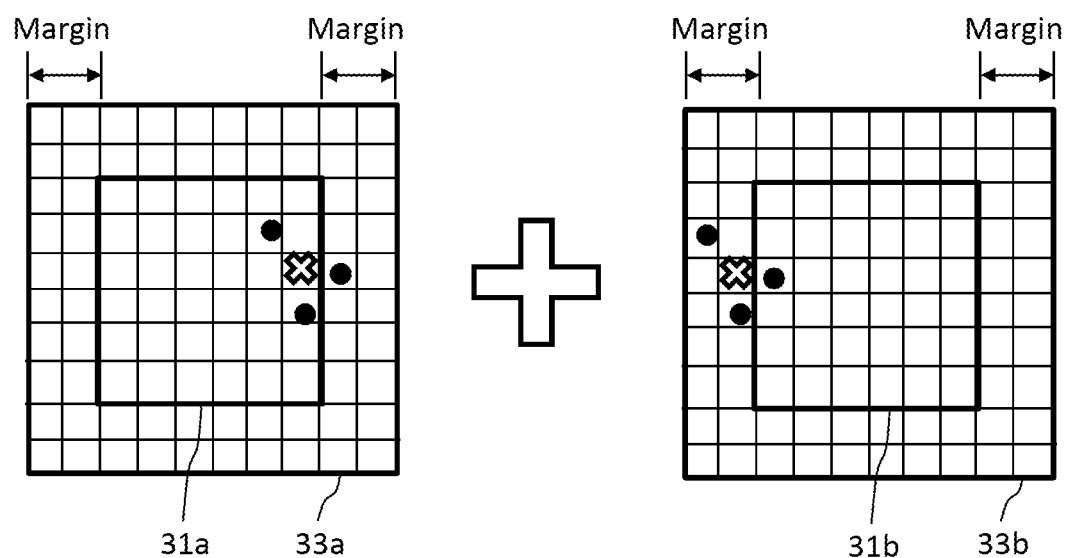

FIGS. 18A and 18B illustrate a method for correcting a defective beam according to the third embodiment. FIG. 18A shows the case where a position close to the border between two adjacent block regions 31 is irradiated with a defective beam. Further, FIG. 18A shows the case where, in order to correct a dose abnormality (irregularity) due to a defective beam irradiating a block 31a (block 1), the dose to a pixel in the block 31b (block 2) needs to be corrected. According to the third embodiment, as shown in FIG. 18B, using each margined block region 33 which is formed by adding a margin region to each block region 31, the defective beam irradiating a position close to the border between the blocks 31 is made to overlappingly belong to two or more adjacent margined block regions 33a and 33b. In other words, without purposely particularly narrowing down to one margined block region 33 as a target of affiliation determination, defective beam correction is performed in parallel in a plurality of margined block regions 33 as they are. According to the third embodiment, as shown in FIG. 18B, pixels in the margined region may also be used for defective beam correction.

In the defective beam correcting step (S122), when the position irradiated with a defective beam in the multiple beams 20 overlaps with another margined block region 33, one of the plurality of defective beam correction units 76 calculates, with respect to the another margined block regions 33, a correction dose at at least one position for correcting a dose abnormality (irregularity) resulting from the defective beam, by using data on the dose at each position in the own margined block region 33. On the other hand, when the position irradiated with a defective beam in the multiple beams 20 overlaps with a plurality of margined block regions 33, two or more ones of the plurality of defective beam correction units 76 calculate, in parallel with respect to the plurality of margined block regions 33, a correction dose at at least one position for correcting a dose abnormality (irregularity) resulting from the defective beam, by using data on the dose at each position in the own margined block region 33.

As described above, when a defective beam irradiates a position close to the border between or among block regions 31, defective beam correction processing of the same correction contents is overlappingly performed in a plurality of margined block regions 33. The contents of each defective beam correction processing may be the same as those of the first and second embodiments.

In the data processing step (S125), with respect to a result of defective beam correction processing performed overlappingly in a plurality of margined block regions 33 for correcting the same position irradiated with a defective beam, the data processing unit 71 processes data in order to select each block region 31 in overlapped plurality of margined block regions 33. In other words, data is processed such that the margins of the plurality of margined block regions 33 where the defective beam correction processing was performed is deleted. Thereby, the correction dose in one set selected from a plurality of sets each being a correction dose at at least one position in any one margined block region 33 which is overlappingly calculated in parallel among a plurality of margined block regions 33 controls the dose at at least one position for correcting a dose abnormality (irregularity).

The contents of each of the irradiation time calculating step (S140) and the writing step (S142) are the same as those of the first embodiment. In the writing step (S142), a pattern is written on the target object using the multiple beams 20 where the dose at at least one position for correcting a dose abnormality (irregularity) is controlled by the correction dose of one set selected from a plurality of sets each being a correction dose at at least one position in any one margined block region 33 calculated in parallel among a plurality of margined block regions 33.

Although the third embodiment describes the case where defective beam correction processing is performed using the margined block region 33, it is not limited thereto. It is also preferable that each processing from the rasterization processing to the defective beam correction may be performed using the margined block region 33. In that case, processing can be independently executed for each margined block region 33 from the beginning without exchanging data between respective block regions 31. As a result, the efficiency of parallel processing can further be improved.

Embodiments have been explained referring to specific examples described above. However, the present invention is not limited to these specific examples. The above examples describe the case where each of the multiple beams 20 individually controls, for each beam, the irradiation time within the maximum irradiation time Ttr for one shot. However, it is not limited thereto. For example, the maximum irradiation time Ttr for one shot is divided into a plurality of sub-shots each having a different irradiation time. Then, for each beam, a combination of sub-shots is selected from the plurality of sub-shots in order that the combination may become the irradiation time for one shot. It is also preferable to control, for each beam, the irradiation time for one shot by continuously applying the same beam irradiation to pixels whose combinations of selected sub-shots are the same as each other.

Further, when performing multiple writing, a dose abnormality (irregularity) resulting from a defective beam in a certain pass in the multiple writing may be corrected by modulating the dose of other normal beam, in other pass, which irradiates the same position.

While the case of inputting a 10-bit control signal for controlling each control circuit 41 has been described above, the number of bits may be suitably set. For example, a 2-bit (or any one of 3 to 9 bit) control signal may be used. Alternatively, a control signal of 11 bits or more may be used.

While the apparatus configuration, control method, and the like not directly necessary for explaining the present invention are not described, some or all of them can be appropriately selected and used on a case-by-case basis when needed. For example, although description of the configuration of the control circuit for controlling the writing apparatus 100 is omitted, it should be understood that some or all of the configuration of the control circuit can be selected and used appropriately when necessary.

In addition, any other multiple charged particle beam writing apparatus and multiple charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple charged particle beam writing apparatus comprising:
   a plurality of dose data generation circuits configured to generate data on a dose at each position in a writing region of a target object;
   a margined block region generation circuit configured to generate a plurality of margined block regions each formed by adding a margin region to a periphery of each block region of a plurality of block regions obtained by dividing the writing region of the target object;
   a detection circuit configured to detect a defective beam in multiple charged particle beams;
   a specifying circuit configured to specify, for each of the defective beam detected, a position irradiated with the defective beam;
   an affiliation determination circuit configured to determine a margined block region, in the plurality of margined block regions, to which the position irradiated with the defective beam belongs, based on conditions set according to a sub-block region, in a plurality of sub-block regions acquired by dividing the margined block region, in which the position irradiated with the defective beam in the multiple charged particle beams is located;
   a defective beam correction circuit configured to calculate a correction dose at at least one position for correcting a dose abnormality resulting from the defective beam, by using data on a dose at each position in the margined block region to which the position irradiated with the defective beam belongs; and a writing mechanism configured to write a pattern on the target object, using the multiple charged particle beams in which the dose at the at least one position for correcting the dose abnormality has been controlled by the correction dose.

2. The apparatus according to claim 1 further comprising:
a position deviation correction circuit configured to correct an irradiation pattern position deviation resulting from an irradiation position deviation of a beam of the multiple charged particle beams, wherein
the affiliation determination circuit acquires a dose to be used for the conditions from dose data in which the irradiation pattern position deviation resulting from the irradiation position deviation at each position in the margined block region to which the position irradiated with the defective beam belongs has been corrected, in order to determine the margined block region to which the position irradiated with the defective beam belongs.

3. The apparatus according to claim 1, wherein the affiliation determination circuit acquires a dose used for the conditions from data on a dose at each position where an irradiation pattern position deviation resulting from an irradiation position deviation of a beam of the multiple charged particle beams is not corrected, in order to determine the margined block region to which the position irradiated with the defective beam belongs.

4. The apparatus according to claim 1, wherein one of the plurality of sub-block regions is defined by a region located at an inner side of peripheral pixels along inside a block region of the plurality of block regions before the margin region is added.

5. The apparatus according to claim 1, wherein four of the plurality of sub-block regions are defined by four regions except for pixels at four corners in peripheral pixels along inside a block region of the plurality of block regions before the margin region is added.

6. A multiple charged particle beam writing apparatus comprising:
a plurality of dose data generation circuits configured to generate data on a dose at each position in a writing region of a target object;
a margined block region generation circuit configured to generate a plurality of margined block regions each formed by adding a margin region to a periphery of each block region of a plurality of block regions obtained by dividing the writing region of the target object;
a detection circuit configured to detect a defective beam in multiple charged particle beams;
a specifying circuit configured to specify, for each of the defective beam detected, a position irradiated with the defective beam;
at least one defective beam correction circuit configured to calculate a correction dose at at least one position for correcting a dose abnormality resulting from the defective beam, by using data on a dose at each position in an own margined block region, with respect to one margined block region in a case where the position irradiated with the defective beam in the multiple charged particle beams overlaps with the one margined block region, and in parallel with respect to a plurality of margined block regions in a case where the position irradiated with the defective beam overlaps with the plurality of margined block regions, and
a writing mechanism configured to write a pattern on the target object, using the multiple charged particle beams in which a dose at at least one position for correcting the dose abnormality has been controlled by the correction dose at the at least one position calculated with respect to the one margined block region in the case where the position irradiated with the defective beam overlaps with the one margined block region, and using the multiple charged particle beams in which the dose at the at least one position for correcting the dose abnormality has been controlled by a correction dose in one set selected from a plurality of sets each being a correction dose at at least one position in any one margined block region calculated in parallel with respect to the plurality of margined block regions in the case where the position irradiated with the defective beam overlaps with the plurality of margined block regions.

7. The apparatus according to claim 6, wherein a size of the margin region is one of twice a beam size and more than twice the beam size.

8. The apparatus according to claim 6 further comprising:
a data processing circuit configured to process data such that margins of the plurality of margined block regions where the defective beam correction processing was performed is deleted.

9. A multiple charged particle beam writing method comprising:
generating data on a dose at each position in a writing region of a target object;
generating a plurality of margined block regions each formed by adding a margin region to a periphery of each block region of a plurality of block regions obtained by dividing the writing region of the target object;
detecting a defective beam in multiple charged particle beams;
specifying, for each of the defective beam detected, a position irradiated with the defective beam;
determining a margined block region, in the plurality of margined block regions, to which the position irradiated with the defective beam belongs, based on conditions set according to a sub-block region, in a plurality of sub-block regions acquired by dividing the margined block region, in which the position irradiated with the defective beam in the multiple charged particle beams is located;
calculating a correction dose at at least one position for correcting a dose abnormality resulting from the defective beam, by using data on a dose at each position in the margined block region to which the position irradiated with the defective beam belongs; and
writing a pattern on the target object, using the multiple charged particle beams in which the dose at the at least one position for correcting the dose abnormality has been controlled by the correction dose.

10. A multiple charged particle beam writing method comprising:
generating data on a dose at each position in a writing region of a target object;
generating a plurality of margined block regions each formed by adding a margin region to a periphery of each block region of a plurality of block regions obtained by dividing the writing region of the target object;
detecting a defective beam in multiple charged particle beams;
specifying, for each of the defective beam detected, a position irradiated with the defective beam;

calculating a correction dose at at least one position for correcting a dose abnormality resulting from the defective beam, by using data on a dose at each position in an own margined block region, with respect to one margined block region in a case where the position irradiated with the defective beam in the multiple charged particle beams overlaps with the one margined block region, and in parallel with respect to a plurality of margined block regions in a case where the position irradiated with the defective beam overlaps with the plurality of margined block regions, and writing a pattern on the target object by using the multiple charged particle beams in which a dose at at least one position for correcting the dose abnormality has been controlled by the correction dose at the at least one position calculated with respect to the one margined block region in the case where the position irradiated with the defective beam overlaps with the one margined block region, and by using the multiple charged particle beams in which the dose at the at least one position for correcting the dose abnormality has been controlled by a correction dose in one set selected from a plurality of sets each being a correction dose at at least one position in any one margined block region calculated in parallel with respect to the plurality of margined block regions in the case where the position irradiated with the defective beam overlaps with the plurality of margined block regions.

\* \* \* \* \*